(12) United States Patent
Jung et al.

(10) Patent No.: US 9,679,788 B2
(45) Date of Patent: Jun. 13, 2017

(54) APPARATUS AND METHOD FOR TREATING SUBSTRATE

(75) Inventors: Eunsun Jung, Suwon-si (KR); Woo Young Kim, Cheonan-si (KR); Chan Young Heo, Cheonan-si (KR); Jeong Seon Park, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 1385 days.

(21) Appl. No.: 13/537,914

(22) Filed: Jun. 29, 2012

(65) Prior Publication Data
US 2013/0000140 A1 Jan. 3, 2013

(30) Foreign Application Priority Data

Jun. 30, 2011 (KR) .................. 10-2011-0064987
Oct. 13, 2011 (KR) .................. 10-2011-0104768

(51) Int. Cl.
 *F26B 5/00* (2006.01)
 *H01L 21/67* (2006.01)
(52) U.S. Cl.
 CPC .. *H01L 21/67034* (2013.01); *H01L 21/67017* (2013.01)
(58) Field of Classification Search
 CPC .................. H01L 21/67034; H01L 21/67017
 See application file for complete search history.

(56) References Cited

U.S. PATENT DOCUMENTS

| | | | | |
|---|---|---|---|---|
| 2002/0195130 A1* | 12/2002 | Twu | .................. | H01L 21/67034 134/61 |
| 2003/0208922 A1* | 11/2003 | Hsu | .................. | H01L 21/67034 34/468 |
| 2007/0259766 A1* | 11/2007 | Jackson | .................... | B08B 3/06 494/36 |
| 2009/0178693 A1* | 7/2009 | Turner | .................. | B01D 53/00 134/10 |
| 2011/0056913 A1* | 3/2011 | Mayer | ...................... | C23F 1/08 216/84 |
| 2011/0314689 A1* | 12/2011 | Okuchi | ............... | C11D 11/0047 34/357 |
| 2012/0048304 A1* | 3/2012 | Kitajima | ........... | H01L 21/67034 134/30 |
| 2012/0152898 A1* | 6/2012 | Cho | ...................... | B08B 7/0021 216/59 |

FOREIGN PATENT DOCUMENTS

| | | |
|---|---|---|
| CN | 1383191 A | 12/2002 |
| CN | 1779920 A | 5/2006 |
| CN | 101362674 A | 2/2009 |

(Continued)

*Primary Examiner* — Michael Barr
*Assistant Examiner* — Benjamin L Osterhout
(74) *Attorney, Agent, or Firm* — Harness, Dickey & Pierce, PLC

(57) ABSTRACT

Provided are an apparatus and method for treating a substrate, and more particularly, to an apparatus and method for treating a substrate using a supercritical fluid. The apparatus for treating a substrate includes a process chamber in which an organic solvent remaining on a substrate is dissolved using a fluid provided as a supercritical fluid to dry the substrate and a recycling unit in which the organic solvent is separated from the fluid discharged from the process chamber to recycle the fluid.

22 Claims, 16 Drawing Sheets

(56) References Cited

FOREIGN PATENT DOCUMENTS

| | | |
|---|---|---|
| JP | 01-170026 | 7/1989 |
| JP | 09-135066 | 5/1997 |
| JP | 2000343053 A | 12/2000 |
| JP | 2003-031533 | 1/2003 |
| JP | 2003-117508 | 4/2003 |
| JP | 2004025029 A | 1/2004 |
| JP | 2004-335988 | 11/2004 |
| JP | 2006-269818 | 10/2006 |
| JP | 2006-281014 | 10/2006 |
| JP | 2006-294662 | 10/2006 |
| JP | 2006-326429 | 12/2006 |
| JP | 2008-130685 | 6/2008 |
| JP | 2012-049446 | 3/2012 |
| KR | 2004-0058207 A | 7/2004 |
| KR | 10-0822373 B1 | 4/2008 |
| TW | 438631 B | 6/2001 |
| TW | 200405459 A | 4/2004 |
| WO | WO 2010/104238 | 9/2010 |

\* cited by examiner

|      | IPA Separation Rate |
|------|---------------------|
| 30°C | 48.95%              |
| 20°C | 42.8%               |
| 10°C | 38.8%               |

APPARATUS AND METHOD FOR TREATING SUBSTRATE

CROSS-REFERENCE TO RELATED APPLICATIONS

This U.S. non-provisional patent application claims priority under 35 U.S.C. §119 of Korean Patent Application Nos. 10-2011-0064987, filed on Jun. 30, 2011, and 10-2011-0104768, filed on Oct. 13, 2011, the entire contents of which are hereby incorporated by reference.

BACKGROUND OF THE INVENTION

The present disclosure herein relates to an apparatus and method for treating a substrate, and more particularly, to an apparatus and method for treating a substrate using a supercritical fluid.

Semiconductor devices are manufactured through various processes including a photolithography process for forming circuit patterns on a substrate such as a silicon wafer or the like. When the semiconductor devices are manufactured, various foreign substances such as particles, organic contaminants, metal impurities, and the like may be generated. The foreign substances may cause substrate defects to directly exert a bad influence on yield of semiconductor devices. Thus, a cleaning process for removing the foreign substances may be essentially involved in a semiconductor manufacturing process.

Generally, in a typical cleaning process, foreign substances remaining on a substrate are removed using detergent and then the substrate is cleaned using deionized water (DI-water) to dry the cleaned substrate using isopropyl alcohol (IPA). However, the drying process may have low efficiency in a case where a semiconductor device has fine circuit patterns. In addition, since damage of the circuit patterns, i.e., pattern collapse frequently occurs during the drying process, the drying process is unsuitable for a semiconductor device having a line width of about 30 nm or less.

Thus, to solve the above-described limitation, studies about technologies for drying a substrate using a supercritical fluid are actively being carried out.

SUMMARY OF THE INVENTION

The present invention provides an apparatus for treating a substrate using a supercritical fluid and a method for treating the substrate using the same.

The present invention also provides an apparatus for treating a substrate in which a supercritical fluid used for drying the substrate is recycled and a method for treating the substrate using the same.

The feature of the present invention is not limited to the aforesaid, but other features not described herein will be clearly understood by those skilled in the art from this specification and the accompanying drawings.

The prevent invention provides an apparatus for treating a substrate.

Embodiments of the present invention provide apparatuses for treating a substrate, the apparatuses including: a process chamber in which an organic solvent remaining on a substrate is dissolved using a fluid provided as a supercritical fluid to dry the substrate; and a recycling unit in which the organic solvent is separated from the fluid discharged from the process chamber to recycle the fluid.

In some embodiments, the recycling unit may include a separation module for cooling the fluid in which the organic solvent is dissolved to separate the organic solvent from the fluid.

In other embodiments, the separation module may be provided in plurality, and the plurality of separation modules may be connected to each other in series.

In still other embodiments, the separation module may include: a separation tank in which the fluid discharged from the process chamber is introduced; a cooling member for cooling the separation tank; a drain tube disposed in a lower portion of the separation tank to discharge the organic solvent liquefied and separated from the fluid; and a first exhaust tube disposed in an upper portion of the separation tank to discharge the fluid from which the organic solvent is separated.

In even other embodiments, the separation module may further include an inflow tube for supplying the fluid discharged from the process chamber into the lower portion of the separation tank.

In yet other embodiments, the separation module may further include a reverse pressure regulator disposed in the first exhaust tube to constantly maintain an internal pressure of the separation tank.

In further embodiments, the recycling unit may further include a column module providing an absorption material for absorbing the organic module into the fluid discharged from the separation module to separate the organic solvent from the fluid, the column module may be provided in plurality, and the plurality of column modules may be connected to each other in series.

In still further embodiments, the column module may be provided in plurality, and the plurality of column modules may be connected parallel to each other.

In even further embodiments, the column module may include: an absorption column for providing the absorption material into the fluid discharged from the separation module; a temperature maintenance member for constantly maintaining an internal temperature of the absorption column; and a second exhaust tube for discharging the fluid from which the organic solvent is separated by the absorption material.

In yet further embodiments, the column module may further include a concentration sensor disposed in the second exhaust tube to detect a concentration of the organic solvent contained in the fluid discharged from the second exhaust tube.

In much further embodiments, the absorption material may include zeolite.

In still much further embodiments, the recycling unit may include a column module providing an absorption material for absorbing the organic module into the fluid discharged from the process chamber to separate the organic solvent from the fluid.

In other embodiments of the present invention, methods for treating a substrate include: dissolving an organic solvent remaining on the substrate using a fluid provided as a supercritical fluid to dry the substrate; and separating the organic solvent from the fluid to recycle the fluid.

In some embodiments, the recycling of the fluid may include cooling the fluid in which the organic solvent is dissolved to separate the organic solvent from the fluid.

In other embodiments, the recycling of the fluid may further include providing an absorption material for absorbing the organic solvent into the fluid to separate the organic solvent from the fluid.

In still other embodiments of the present invention, apparatuses for treating a substrate include: a process chamber in which an organic solvent remaining on the substrate is dissolved using a fluid provided as a supercritical fluid to dry the substrate; a storage tank in which the fluid is stored in a liquid state; a water supply tank receiving the fluid from the storage tank to produce the supercritical fluid and provide the supercritical fluid into the process chamber; and a recycling unit in which the organic solvent is separated from the fluid discharged from the process chamber to recycle the fluid and supply the recycled fluid into the storage tank.

In some embodiments, the recycling unit may include a separation module for cooling the fluid in which the organic solvent is dissolved to separate the organic solvent from the fluid.

In other embodiments, the recycling unit may further include a column module providing an absorption material for absorbing the organic module into the fluid discharged from the separation module to separate the organic solvent from the fluid.

In still other embodiments, the apparatuses may further include a first condenser for changing the gaseous fluid discharged from the recycling unit into a liquid fluid to supply the liquid fluid into the storage tank In even other embodiments, the apparatuses may further include: a second condenser for changing the gaseous fluid discharged from the storage tank into the liquid fluid; and a pump receiving the liquid fluid from the second condenser to supply the liquid fluid into the water supply tank, and wherein, in the water supply tank, the fluid compressed at a pressure greater than a critical pressure by the pump is heated at a temperature greater than a critical temperature to produce the supercritical fluid.

In even other embodiments of the present invention, methods for treating a substrate include: storing a liquid fluid into a storage tank; changing the stored fluid into a supercritical fluid; dissolving an organic solvent remaining on the substrate using the fluid provided as the supercritical fluid to dry the substrate; separating the organic solvent from the fluid in which the organic solvent is dissolved to recycle the fluid; and changing the recycled fluid into a liquid fluid to supply the liquid fluid into the storage tank.

In some embodiments, the recycling of the fluid may include a first recycling process of cooling the fluid in which the organic solvent is dissolved to separate the organic solvent from the fluid.

In other embodiments, the recycling of the fluid may further include a second recycling process of providing an absorption material for absorbing the organic solvent into the fluid to separate the organic solvent from the fluid.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present are provided so that this disclosure will be thorough and complete, and will fully convey the scope of the present invention to those skilled in the art. The present invention may, however, be embodied in different forms and should not be constructed as limited to the embodiments set forth herein. Thus, it will be apparent to those skilled in the art that various modifications and variations can be made in the present invention without departing form the spirit or scope of the invention.

It will also be understood that although specific terms are used and drawings are attached herein to easily describe the exemplary embodiments of the present invention, the present invention is not limited by these terms and the attached drawings.

Moreover, detailed descriptions related to well-known functions or configurations will be ruled out in order not to unnecessarily obscure subject matters of the present invention.

An apparatus 100 for treating a substrate according to the present invention may be an apparatus for performing a cleaning process on a substrata S.

Here, it should be understood as a comprehensive concept that the substrate S can include various wafers including silicon wafers, glass substrates, organic substrates, and the like, as well as, substrates used for manufacturing semiconductor devices, displays, products including a thin film on which a circuit is formed, and the like.

Hereinafter, an apparatus 100 for treating a substrate according to an embodiment will be described.

Figure 1:
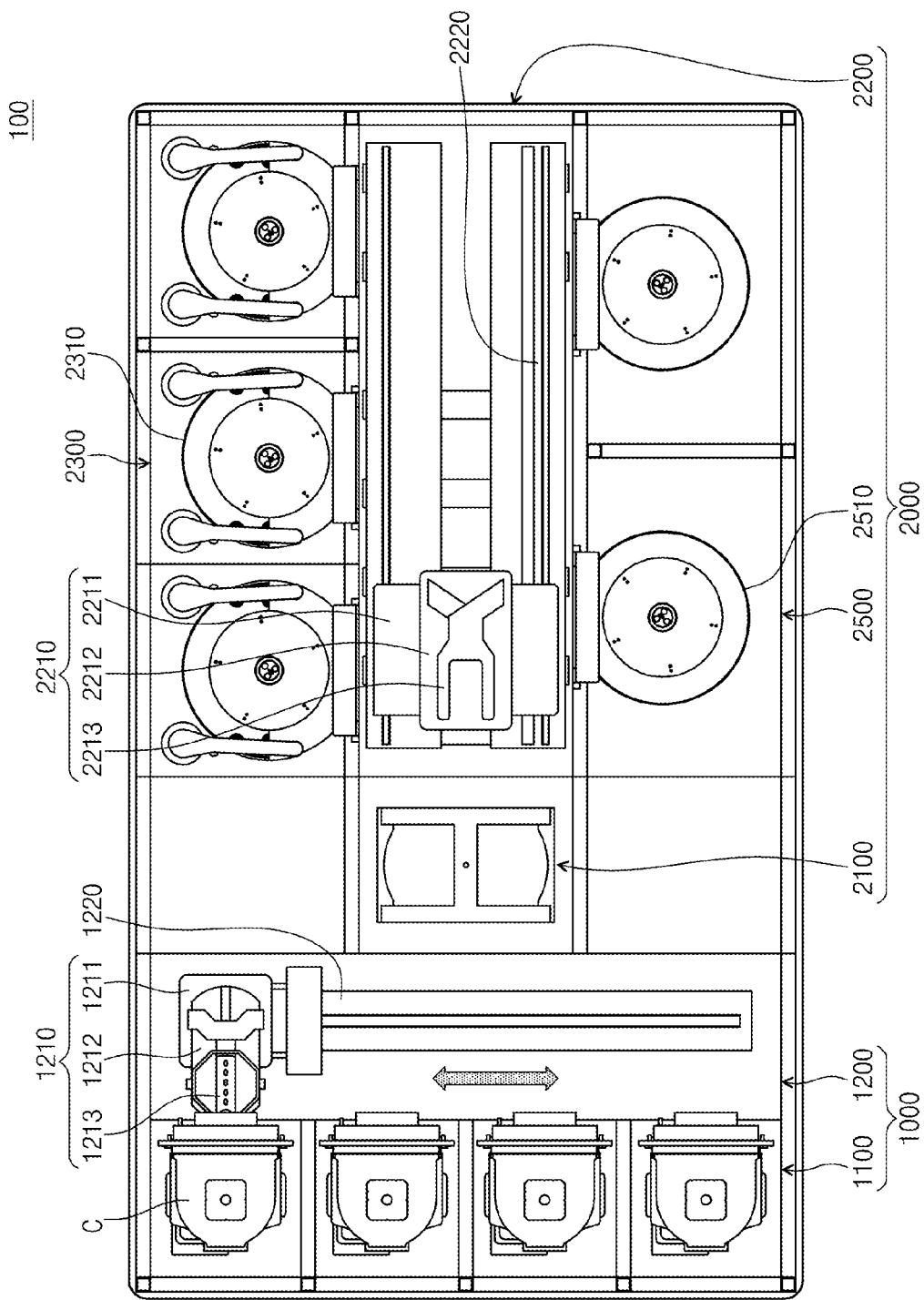
FIG. 1 is a plan view of an apparatus for treating a substrate according to an embodiment of the present invention.

FIG. 1 is a plan view of the apparatus 100 for treating a substrate according to an embodiment of the present invention.

The apparatus 100 for treating a substrate includes an index module 1000, a process module 2000, a supercritical fluid supply unit 3000, and a recycling unit 4000. The index module 1000 receives a substrate S from the outside to provide the substrate S into the process module. The process module 2000 performs a cleaning process on the substrate S. The supercritical fluid supply unit 3000 supplies a supercritical fluid to be used for the cleaning process, and the recycling unit 4000 recycles the supercritical fluid used in the cleaning process.

The index module 1000 may be an equipment front end module (EFEM). Also, the index module 1000 includes a load port 1100 and a transfer frame 1200. The load port 1100, the transfer frame 1200, and the process module 2000 may be successively arranged in a line.

Here, an arranged direction of the load port 1100, the transfer frame 1200, and the process module 2000 is referred to as a first direction X. Also, when viewed from an upper side, a direction perpendicular to the first direction X is referred to as a second direction Y, and a direction perpendicular to the first direction X and the second direction Y is referred to as a third direction Z.

At least one load port 1100 may be provided in the index module 1000.

The load port 1100 is disposed on a side of the transfer frame 1200. When the load port 1100 is provided in plurality, the load ports 1100 may be arranged in a line along the second direction Y.

The number and arrangement of load ports 1100 are not limited to the above-described example. For example, the number and arrangement of load ports 1100 may be adequately selected in consideration of a foot print of the apparatus 100 for treating a substrate, process efficiency, and a relative arrangement with respect to other apparatuses 100 for treating a substrate.

A carrier C in which the substrate C is received is disposed on the load port 1100. The carrier C is transferred from the outside and then loaded on the load port 1100, or is unloaded from the load port 1100 and then transferred into the outside. For example, the carrier C may be transferred between the apparatuses 100 for treating a substrate by a transfer unit such as an overhead hoist transfer (OHT). Here, the substrate S may be transferred by the other transfer unit such as an automatic guided vehicle, a rail guided vehicle, or the like instead of the OHT, or a worker.

The substrate S is received into the carrier C. A front opening unified pod (FOUP) may be used as the carrier C.

At least one slot for supporting an edge of the substrate S may be provided within the carrier C.

When the slot is provided in plurality, the slots may be spaced apart from each other along the third direction Z.

Thus, the substrate S may be placed within the carrier C. For example, the carrier C may receive twenty-five substrates S.

The inside of the carrier C may be isolated from the outside by an openable door and thus be sealed. Thus, it may prevent the substrate S received in the carrier C from being contaminated.

The transfer frame 1200 transfers the substrate S between the carrier C seated on the load port 1100 and the process module 2000. The transfer module 1200 includes an index robot 1210 and an index rail 1220.

The index rail 1220 provides a movement path of the index robot 1210. The index rail 1220 may be disposed in a length direction thereof parallel to the second direction Y.

The index robot 1210 transfers the substrate S. The index robot 1210 may include a base 1211, a body 1212, and an arm 1213.

The base 1211 is disposed on the index rail 1220. Also, the base 1211 may be moved along the index rail 1220. The body 1212 is coupled to the base 1211. Also, the body 1212 may be moved along the third direction Z on the base 1211 or rotated around an axis defined in the third direction Z. The arm 1213 is disposed on the body 1212. Also, the arm 1213 may be moved forward and backward. A hand may be disposed on an end of the arm 1213 to pick up or place the substrate S. The index robot 1210 may include at least one arm 1213. When the arm 1213 is provided in plurality, the arms 1213 may be stacked on the body 1212 and arranged in the third direction Z. Here, the arms 1213 may be independently operated.

Thus, in the index robot 1210, the base 1211 may be moved in the second direction Y on the index rail 1220. Also, the index robot 1210 may take the substrate S out of the carrier C to transfer the substrate S into the process module 2000 or take the substrate S out of the process module 2000 to receive the substrate S into the carrier C according to operations of the body 1212 and the arm 1213.

The index rail 1220 may be omitted in the transfer frame 1200, and the index robot 1210 may be fixed to the transfer frame 1200. In this case, the index robot 1210 may be disposed on a central portion of the transfer frame 1200.

The process module 2000 receives the substrate S from the index module 1000 to perform the cleaning process on the substrate S. The process module 2000 includes a buffer chamber 2100, a transfer chamber 2200, a first process chamber 2300, and a second process chamber 2500. The buffer chamber 2100 and the transfer chamber 2200 are disposed along the first direction X, and the transfer chamber 2200 is disposed in a length direction thereof parallel to the first direction X. The process chambers 2300 and 2500 may be disposed on a side surface of the transfer chamber 2200 in the second direction Y.

Here, the first process chamber 2300 may be disposed on one side of the transfer chamber 2200 in the second direction Y, and the second process chamber 2500 may be disposed on the other side opposite to the one side on which the first process chamber is disposed. The first process chamber 2300 may be provided in one or plurality. When the plurality of first process chambers 2300 are provided, the first process chambers 2300 may be disposed on one side of the transfer chamber 2200 along the first direction X, stacked along the third direction Z, or disposed in combination thereof. Similarly, the second process chamber 2500 may be provided in one or plurality. When the plurality of second process chambers are provided, the second process chambers may be disposed on the other side of the transfer chamber 2500 along the first direction X, stacked along the third direction Z, or disposed in combination thereof.

However, the arrangement of each of the chambers in the process module 2000 is not limited to the above-described example. That is, the chambers may be adequately disposed in consideration of process efficiency. For example, as necessary, the first and second process chambers 2300 and 2500 may be disposed along the first direction X on the same side surface as the transfer module 2200 or stacked on each other.

The buffer chamber 2100 is disposed between the transfer frame 1200 and the transfer chamber 2200 to provide a buffer space in which the substrate S transferred between the index module 1000 and the process module 2000 is temporarily stayed. At least one buffer slots on which the substrate S is placed may be provided within the buffer chamber 2100. When the buffer slot is provided in plurality, the buffer slots may be spaced apart from each other along the third direction Z.

The substrate taken out of the carrier C by the index robot 1210 may be seated on the buffer slot, or the substrate C transferred from the process chambers 2300 and 2500 by the transfer robot 2210 of the transfer chamber 2200 may be seated on the buffer slot. On the other hand, the index robot 1210 or the transfer robot 2210 may take the substrate S out of the buffer slot to receive the substrate S into the carrier C or transfer the substrate S into the process chambers 2300 and 2500.

The transfer chamber 2200 transfers the substrate S between the chambers 2100, 2300, and 2500 disposed therearound. The buffer chamber 2100 may be disposed on one side of the transfer chamber 2200 in the first direction X. The process chambers 2300 and 2500 may be disposed on one side or both sides of the transfer chamber 2200 in the second direction Y. Thus, the transfer chamber 2200 may transfer the substrate S between the buffer chamber 2100, the first process chamber 2300, and the second process chamber 2500.

The transfer chamber 2200 includes a transfer rail 2220 and a transfer robot 2210.

The transfer rail 2220 provides a movement path of the transfer robot 2210. The transfer rail 2220 may be disposed parallel to the first direction X. The transfer robot 2210 transfers the substrate S. The transfer robot 2210 includes a base 2211, a body 2212, and an arm 2213. Since each of the components of the transfer robot 2210 is similar to each of those of the index robot 1210, their detailed description will be omitted. The transfer robot 2210 transfers the substrate S between the buffer chamber 2100, the first process chamber 2300, and the second process chamber 2500 by the operations of the body 2212 and the arm 2213 while the base 2211 is moved along the transfer rail 2220.

The first and second process chambers 2300 and 2500 may perform processes different from each other on the substrate S. Here, a first process performed in the first process chamber 2300 and a second process performed in the second process chamber 2500 may be successively performed.

For example, a chemical process, a cleaning process, and a first drying process may be performed in the first process chamber 2300. Also, a second drying process that is a subsequent process of the first process may be performed in the second process chamber 2500. Here, the first drying process may be a wet drying process performed using an organic solvent, and the second drying process may be a supercritical drying process performed using a supercritical fluid. As necessary, only one of the first and second drying processes may be selectively performed.

Figure 2:
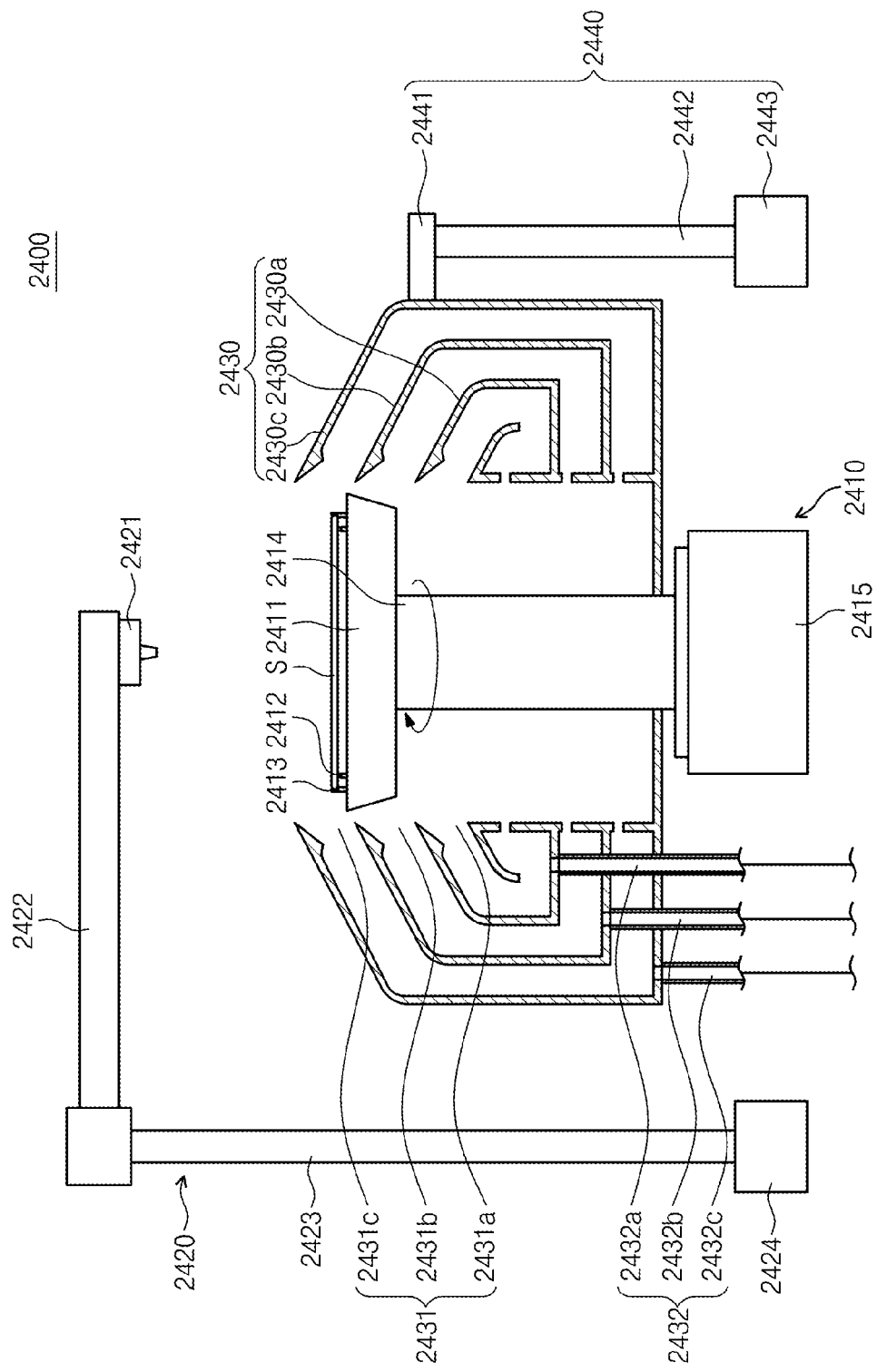
FIG. 2 is a sectional view of a first process chamber of FIG. 1.

Hereinafter, the first process chamber 2300 will be described. FIG. 2 is a sectional view of the first process chamber 2300 of FIG. 1.

The first process is performed in the first process chamber 2300. Here, the first process may include at least one of the chemical process, the cleaning process, and the first drying process. As described above, the first drying process may be omitted.

The first process chamber 2300 includes a housing 2310 and a process unit 2400. The housing 2310 defines an outer wall of the first process chamber 230, and the process unit 2400 is disposed within the housing 2310 to perform the first process.

The process unit 2400 includes a spin head 2410, a fluid supply member 2420, a recovery container 2430, and an elevation member 2440.

The substrate S is seated on the spin head 2410. Also, the spin head 2410 rotates the substrate S during the progression of the processes. The spin head 2410 may include a support plate 2411, a support pin 2412, a chucking pin 2413, a rotation shaft 2414, and a motor 2415.

The support plate 2411 has an upper portion having a shape similar to that of the substrate S. That is, the upper portion of the support plate 2411 may have a circular shape. The plurality of support pins 2412 on which the substrate S is placed and the plurality of chucking pins 2413 for fixing the substrate S are disposed on the support plate 2411. The rotation shaft 2414 rotated by the motor 2415 is fixed and coupled to a bottom surface of the support plate 2411. The motor 2415 generates a rotation force using an external power source to rotate the support plate 2411 through the rotation shaft 2414. Thus, the substrate S may be seated on the spin head 2410, and the support plate 2411 may be rotated to rotate the substrate during the progression of the first process.

Each of the support pins 2412 protrudes from a top surface of the support plate 2411 in the third direction Z. The plurality of support pins 2412 are disposed spaced a preset distance apart from each other. When viewed from an upper side, the support pins 2412 may be arranged in a circular ring shape. A back surface of the substrate S may be placed on the support pins 2412. Thus, the substrate S is seated on the support pins 2412 so that the substrate S is spaced a protruding distance of each of the support pins 2412 apart from the top surface of the support plate 2411 by the support pins 2412.

Each of the chucking pins 2413 may further protrude from the top surface of the support plate 2411 than each of the support pins 2412 in the third direction Z. Thus, the chucking pins 2413 may be disposed farther away from a center of the support plate 2411 than the support pins 2412. The chucking pins 2413 may be moved between a fixed position and a pick-up position along a radius direction of the support plate 2411. Here, the fixed position represents a position spaced a distance corresponding to a radius of the substrate S from the center of the support plate 2411, and the pick-up position represents a position away from the center of the support plate 2411 than the fixed position. The chucking pins 2413 are disposed at the pick-up position when the substrate S is loaded on the spin head 2410 by the transfer robot 2210. When the substrate S is loaded and then the process is performed, the chucking pins 2413 may be moved to the fixed position to contact a side surface of the substrate S, thereby fixing the substrate S in a regular position. Also, when the process is finished and then the transfer robot 2210 picks the substrate S up to unload the substrate S, the chucking pins 2413 may be moved again to the pick-up position. Thus, the chucking pins 2413 may prevent the substrate S from being separated from the regular position by the rotation force when the spin head 2410 is rotated.

The fluid supply member 2420 supplies a fluid onto the substrate S. The fluid supply member 2420 may include a nozzle 2421, a support 2422, a support shaft 2423, and a driver 2424. The support shaft 2423 is disposed so that a length direction thereof is parallel to the third direction Z. The driver 2424 is coupled to a lower end of the support shaft 2423. The driver 2424 rotates the support shaft 2423 or vertically moves the support shaft 2423 along the third direction Z. The support 2422 is vertically coupled to an upper portion of the support shaft 2423. The nozzle 2421 is disposed on a bottom surface of an end of the support 2422.

The nozzle 2421 may be moved between a process position and a standby position by the rotation and elevation of the support shaft 2423 through the driver 2424. Here, the process position represents a position at which the nozzle 2421 is disposed directly above the support plate 2411, and the standby position represents a position at which the nozzle 2421 is disposed deviational from the direct upper side of the support plate 2411.

At least one fluid supply member 2420 may be provided in the process unit 2400. When the fluid supply member 2420 is provided in plurality, the fluid supply members 2420 may supply fluids different from each other, respectively. For example, each of the plurality of fluid supply members 2420 may supply a detergent, a rinsing agent, or an organic solvent. Here, the detergent may include a hydrogen peroxide ($H_2O_2$) solution, a solution in which ammonia ($NH_4OH$), hydrochloric acid (HCl), and sulfuric acid ($H_2SO_4$) are mixed with the hydrogen peroxide ($H_2O_2$) solution, or hydrofluoric acid (HF) solution. Deionized water may be mainly used as the rinsing agent. The organic solvent may include isopropyl alcohol, ethyl glycol, 1-propanol, tetrahydraulic franc, 4-hydroxyl, 4-methyl, 2-pentanone, 1-butanol, 2-butanol, methanol, ethanol, n-propyl alcohol, or dimethylether. For example, a first fluid supply member 2420a may spray the ammonia hydrogen peroxide solution, the second fluid supply member may spray the deionized water, and the third fluid supply member 2420c may spray the isopropyl alcohol solution. However, the organic solvent may be not in a liquid state, but in a gaseous state. If the organic solvent is provided in the gaseous state, the organic solvent may be mixed with an inert gas.

When the substrate S is seated on the spin head 2410, the fluid supply member 2420 may be moved from the standby position to the process position to supply the above-described fluid onto the substrate S. For example, the fluid supply member 2420 may supply the detergent, the rinsing agent, and the organic solvent to perform the chemical process, the cleaning process, and the first drying process, respectively. As described above, the spin head 2410 may be rotated by the motor 2415 to uniformly supply the fluids onto a top surface of the substrate S during the progression of the processes.

The recovery container 2430 provides a space in which the first process is performed. Also, the recovery container 2430 recovers the fluid used for the first process. When viewed from an upper side, the recovery container 2430 is disposed around the spin head 2410 to surround the spin head 2410 and has an opened upper side. At least one recovery container 2430 may be provided in the process unit 2400. Hereinafter, the process unit 2400 including three recovery containers 2430, i.e., a first recovery container 2430a, a second recovery container 2430b, and a third recovery container 2430c will be described. However, the number of recovery containers 2430 may be differently selected according to the number of fluids and conditions of the first process.

Each of the first, second, and third recovery containers 2430a, 2430b, and 2430c may have a circular ring shape to surround the spin head 2410. Also, the first, second, and third recovery containers 2430a, 2430b, and 2430c may be disposed away from a center of the spin head 2410 in an order of the first recovery container 2430a, the second recovery container 2430b, and the third recovery container 2430c. That is, the first recovery container 2430a surrounds the spin head 2410, the second recovery container 2430b surrounds the first recovery container 2430a, and the third recovery container 2430c surrounds the second recovery container 2430b. Thus, inflow holes 2431 may be arranged in the third direction Z.

The first recovery container 2430a has a first inflow hole 2431a defined by an inner space thereof. The second recovery container 2430b has a second inflow hole 2431b defined by a space between the first recovery container 2430a and the second recovery container 2430b. The third recovery container 2430c has a third recovery container 2430c defined by a space between the second recovery container 2430b and the third recovery container 2430c. A recovery line 2432 extending downward along the third direction Z is connected to a bottom surface of each of the first, second, and third recovery container 2430a, 2430b, and 2430c. Each of the first, second, and third recovery lines 2432a, 2432b, and 2432c discharges the fluids recovered into the first, second, and third recovery container 2430a, 2430b, and 2430c to supply the fluids into an external fluid recycling system (not shown). The fluid recycling system (not shown) may recycle the recovered fluids to reuse the fluids.

The elevation member 2440 moves the recovery container 2430 in the third direction Z. Thus, the recovery container 2430 may be changed in relative height with respect to the spin head 2410. When the recovery container 2430 is provided in plurality, the inflow hole 2431 of one recovery container 2430 may be selectively adjusted in height so that the inflow hole 2431 is disposed on a horizontal plane of the substrate S seated on the spin head 2410.

The elevation member 2440 includes a bracket 2441, an elevation shaft 2442, and an elevator 2443. The bracket 2441 is fixed to the recovery container 2430. The bracket 2441 has one end fixed and coupled to the elevation shaft 2442 moved in the third direction Z by the elevator 2443. When the recovery container 2430 is provided in plurality, the bracket 2441 may be coupled to the outermost recovery container 2430.

When the substrate S is loaded on the spin head 2410 or unloaded from the spin head 2410, the elevation member 2440 may move the recovery container 2430 downward to prevent the recovery container 2430 from interfering with a path of the transfer robot 2210 for transferring the substrate S.

Also, when a fluid is supplied by the fluid supply member 2420 and the spin head 2410 is rotated to perform the first process, the elevation member 2440 may move the recovery container 2430 in the third direction Z to locate the inflow hole 2431 of the recovery container 2430 on the same horizontal plane as the substrate S so that the fluid bouncing from the substrate S by a centrifugal force due to the rotation of the substrate S is recovered. For example, in a case where the first process is performed in an order of the chemical process by the detergent, the cleaning process by the rinsing agent, and the first drying process by the organic solvent, the first, second, and third inflow holes 2431a, 2431b, and 2431c may be moved to the same horizontal plane as the substrate S to recovery the fluids into the first, second, and third recovery containers 2430a, 2430b, and 2430c when the detergent, the rinsing agent, and the organic solvent are supplied, respectively. As described above, when the used fluids are recovered, environmental pollution may be prevented, and also, the expensive fluids may be recycled to reduce the semiconductor manufacturing costs.

The elevation member 2440 may move the spin head 2410 in the third direction Z, instead of moving the recovery container 2430.

Hereinafter, the second process chamber will be described.

The second process is performed in the second process chamber 2500. Here, the second process may be a second drying process for drying the substrate S using a supercritical fluid.

The supercritical fluid represents a fluid in a state in which a material exceeds a critical temperature and a critical pressure, i.e., a material is not classified into liquid and gaseous states by reaching a critical state. The supercritical fluid has a molecular density similar to that of liquid and viscosity similar to that of gas. Since the supercritical fluid has very high diffusion, penetration, and dissolution, the supercritical fluid has an advantage of chemical reaction. Also, since the supercritical fluid does not exert an interface tension to a fine structure due to a very low surface tension thereof, drying efficiency may be superior when the semiconductor device is dried, and pattern collapse may be prevented.

Hereinafter, a supercritical fluid of carbon dioxide ($CO_2$) mainly used for drying the substrate S will be described. However, the present invention is not limited to components and kinds of the supercritical fluid.

Figure 3:
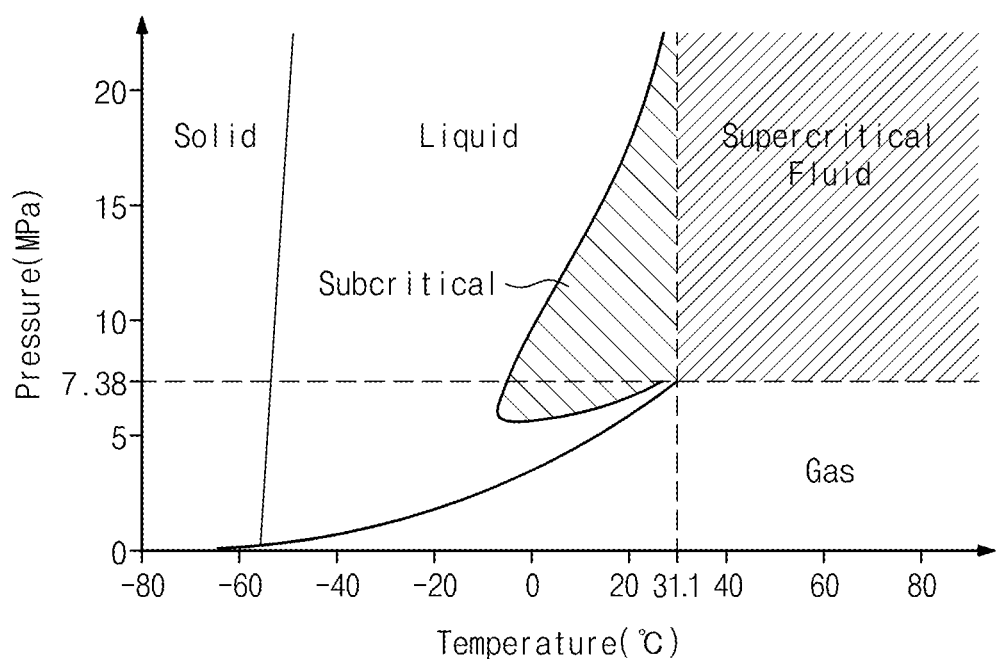
FIG. 3 is a view illustrating a phase transition of carbon dioxide.

FIG. 3 is a view illustrating a phase transition of carbon dioxide. When carbon dioxide has a temperature of about 31.1° C. or more and a pressure of about 7.38 Mpa or more, the carbon dioxide may become in a supercritical state. The carbon dioxide may be nonpoisonous, nonflammable, and inert properties. Also, the supercritical carbon dioxide has a critical temperature and pressure less than those of other fluids. Thus, the supercritical carbon dioxide may be adjusted in temperature and pressure to easily control dissolution thereof. Also, when compared to water or other solvents, the supercritical carbon dioxide may have a diffusion coefficient less by about 10 times to about 100 times than that of the water or other solvents and a very low surface tension. Thus, the supercritical carbon dioxide may have physical properties suitable for performing the drying process. Also, the carbon dioxide may be recycled from byproducts generated by various chemical reactions. In addition, the supercritical carbon dioxide used in the drying process may be circulated and reused to reduce environmental pollution.

Figure 4:
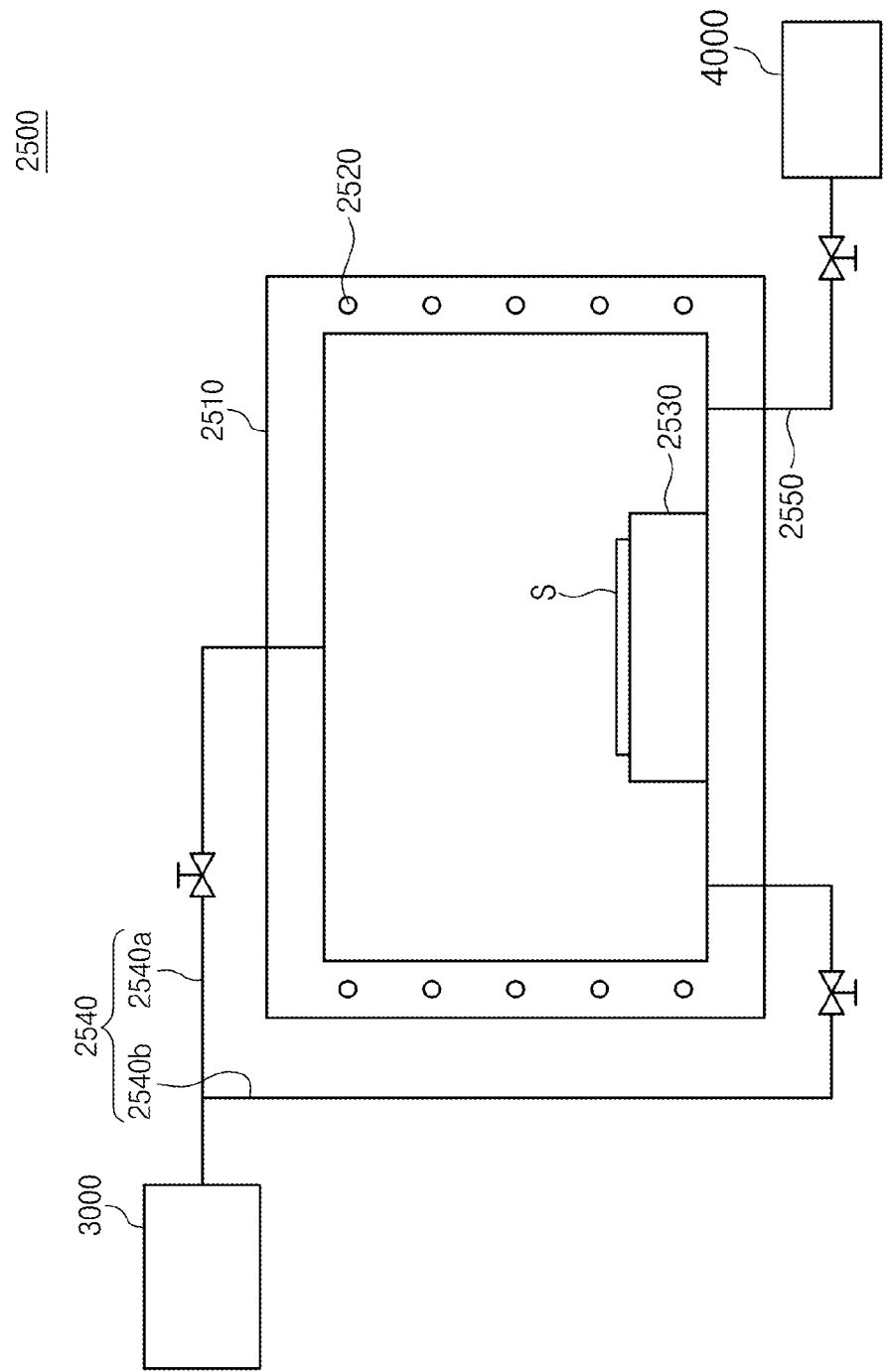
FIG. 4 is a sectional view of a second process chamber of FIG. 1.

FIG. 4 is a sectional view of the second process chamber 2500 of FIG. 1. The second process chamber 2500 includes a housing 2510, a heating member 2520, a support member 2530, a supercritical fluid supply tube 2540, and an exhaust tube 2550.

The inside of the housing 2510 may provide a space which is sealed from the outside to dry the substrate S. The housing 2510 may be formed of a material enough to endure a high pressure. The heating member 2520 for heating the inside of the housing 2510 may be disposed between an inner wall and an outer wall of the housing 2510. Of cause, the present invention is not limited to a position of the heating member 2520. For example, the heating member 2520 may be disposed at a position different from the above-described position.

The support member 2530 supports the substrate S. The support member 2530 may be fixed and installed within the housing 2510. Alternatively, the support member 2530 may not be fixed, but be rotated to rotate the substrate S seated on the support member 2530.

The supercritical fluid supply tube 2540 supplies a supercritical fluid into the housing 2510. The supercritical fluid supply tube 2540 includes at least one of an upper supply tube 2540a and a lower supply tube 2540b. The upper supply tube 2540a is connected to an upper portion of the housing 2510 and the supercritical fluid supply unit 3000. The lower supply tube 2540b is connected to a lower portion of the housing 2510 and the supercritical fluid supply unit 3000. Each of the upper supply tube 2540a and the lower supply tube 2540b may include a valve V for adjusting a flow rate of the supercritical fluid. The valve V may be a switching valve or a flow control valve. Thus, the supercritical fluid may be supplied into the housing 2510 through at least one of the upper and lower supply tubes 2540a and 2540b according to the progression of the second drying process. Here, the lower supply tube 2540b may be branched from the upper supply tube 2540b. Thus, the upper and lower supply tubes 2540a and 2540b may be connected to the same supercritical fluid supply unit 3000. Alternatively, the upper and lower supply tubes 2540a and 2540b may be connected to the supercritical fluid supply units 3000 different from each other, respectively.

The supercritical fluid within the housing 2510 may be discharged through the discharge tube 2550. A valve V may be disposed in the discharge tube 2550. The discharge tube 2550 may be disposed under the housing 2510. Alternatively, the discharge tube 2550 may be disposed above the housing 2510.

Figure 5:
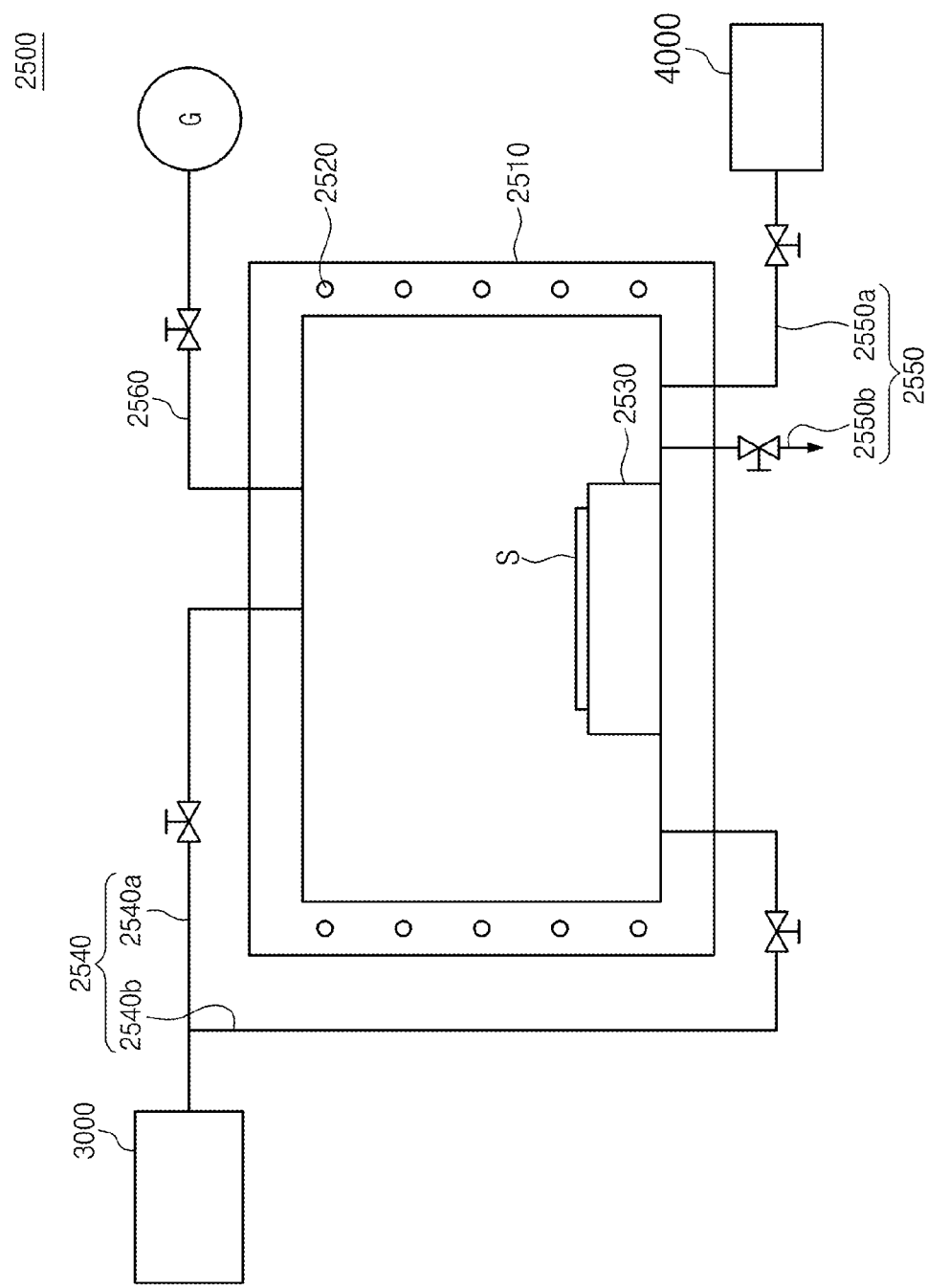
FIG. 5 is a sectional view of a second process chamber of FIG. 1 according to another embodiment of the present invention.

FIG. 5 is a sectional view of the second process chamber 2500 of FIG. 1 according to another embodiment. The second process chamber 2500 according to another embodiment may further include a gas supply tube 2560.

The gas supply tube 2560 supplies an inert gas into the housing 2510. Here, the inert gas may include N2, He, Ne, and Ar. The gas supply tube 2560 is connected to the housing 2510 and a gas supply source G.

The gas supply tube 2560 may be connected to an upper portion of the housing 2510. A valve V for regulating a flow rate may be disposed in the gas supply tube 2560.

When the gas supply tube 2560 is provided to the second process chamber 2500, the inert gas may be discharged through the discharge tube 2550. For this, two discharge tubes 2550a and 2550b may be provided to the second process chamber 2500. Here, the supercritical fluid may be discharged through the first discharge tube 2550a, and the inert gas may be discharged through the second discharge tube 2550b.

In the second process chamber 2500, the number and arrangement of the supercritical fluid supply tube 2540, the gas supply tube 2560, and the discharge tube 2550 may be changed in consideration of the process efficiency, the foot print, and the like. For example, the supercritical fluid supply tube 2540 or the discharge tube 2550 may be disposed on a side surface of the housing 2510. For another example, the first discharge tube 2550a may be connected to a lower portion of the housing 2510, and the second discharge tube 2550b may be connected to an upper portion of the housing 2510.

Thus, the second drying process using the supercritical fluid may be performed in the second process chamber 2500. For example, in the second process chamber 2500, the second drying process using the supercritical fluid may be performed on the substrate S on which the chemical process, the cleaning process, and the first drying process using the organic solvent are successively performed. When the substrate S is seated on the support member 2530 by the transfer robot 2210, the heating member 2520 heats the inside of the housing 2510, and the supercritical fluid is supplied through the supercritical fluid supply tube 2540.

Accordingly, a supercritical fluid atmosphere may be formed within the housing 2510. When the supercritical atmosphere is formed, the supercritical fluid may dissolve the organic solvent remaining on the substrate S because the organic solvent is not completely dried after the organic solvent is used in the first drying process which is performed lastly in the first process chamber 2300. When the organic solvent is sufficiently dissolved and the substrate S is dried, the supercritical fluid is discharged through a discharge hole. Then, the substrate S is unloaded from the support member 2530 by the transfer robot 2210 to take out.

The supercritical fluid supply unit 3000 supplies a supercritical fluid into the second process chamber 2500, and the recycling unit 4000 recycles the supercritical fluid used in the second process chamber 2500 to supply the recycled supercritical fluid into the supercritical fluid supply unit 3000. The supercritical fluid supply unit 3000 and the recycling unit 4000 may be realized as independent separate devices or the whole or a portion of the supercritical fluid supply unit 3000 and the recycling unit 4000 may be included in the apparatus 100 for treating a substrate as one component.

Hereinafter, a supercritical fluid of carbon dioxide will be described. However, this is merely an example for convenience of description. The supercritical fluid may have different components.

Figure 6:
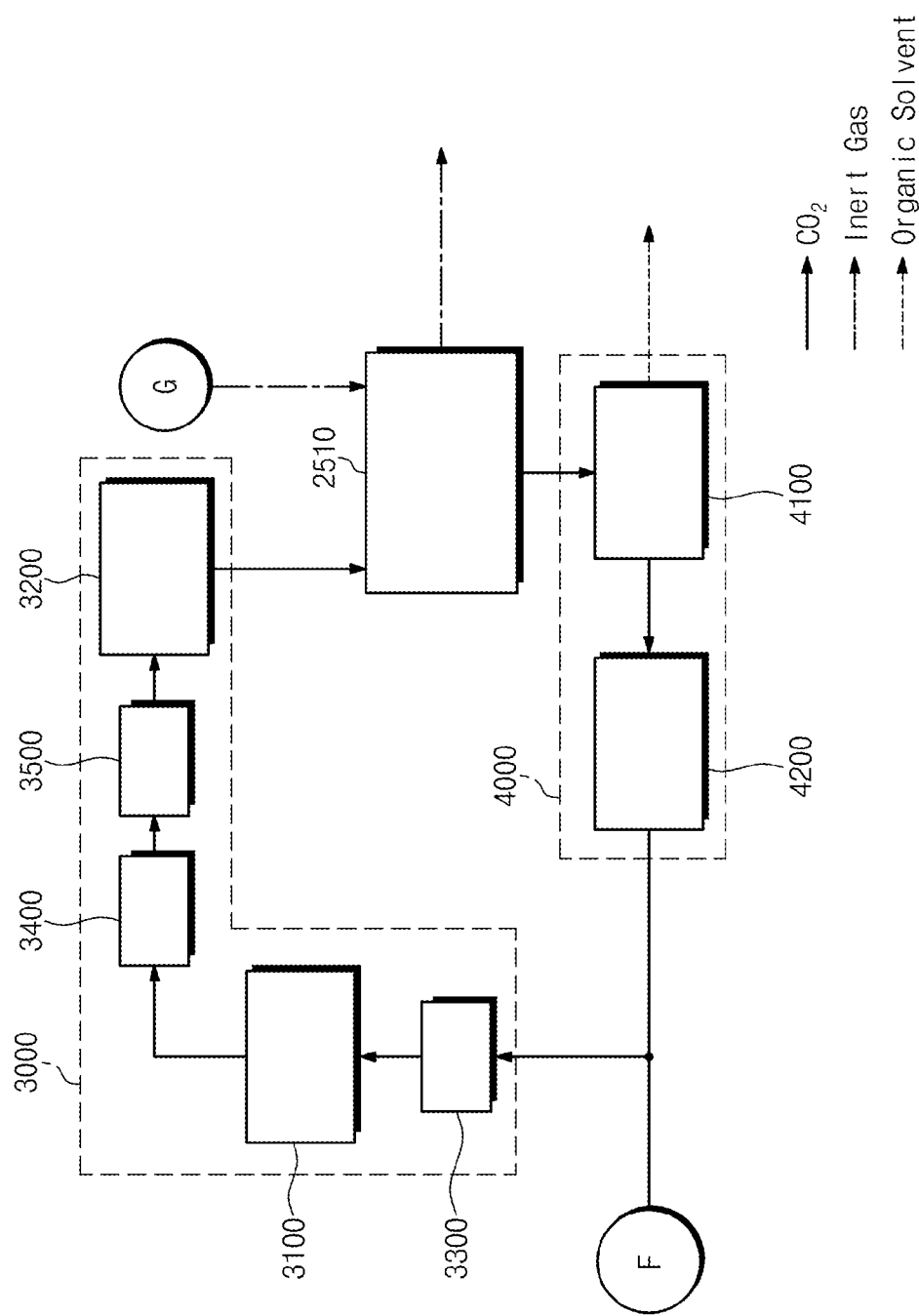
FIG. 6 is a view illustrating a circulation path of the supercritical fluid.

FIG. 6 is a view illustrating a circulation path of the supercritical fluid. Referring to FIG. 6, the supercritical fluid may be recycled while being circulated in the supercritical fluid supply unit 3000, the second process chamber 2500, and the recycling unit 4000.

The supercritical fluid supply unit 3000 may include a storage tank 3100, a water supply tank 3200, a first condenser 3300, a second condenser 3400, and a pump 3500.

Carbon dioxide is stored in the storage tank 3100 in a liquid state. The carbon dioxide may be supplied from the outside or the recycling unit 400 and then stored in the storage tank 3100. Here, the carbon dioxide supplied from the outside or the recycling unit 4000 may be in a gaseous state. The first condenser 3300 changes the gaseous carbon dioxide into liquid carbon dioxide to store the liquid carbon dioxide in the storage tank 3100. Since the liquid carbon dioxide has a volume less than that of the gaseous carbon dioxide, a large amount of carbon dioxide may be stored in the storage tank 3100.

The water supply tank 3200 receives the carbon dioxide from the storage tank 3100 to change the carbon dioxide into the supercritical fluid state. Then, the supercritical fluid is supplied into the second process chamber 2500 of the process module 2000. The carbon dioxide stored in the storage tank 3100 is moved into the water supply tank 3200 while being changed into a gaseous state when the valve V connecting the storage tank 3100 to the water supply tank 3200 is opened. Here, the second condenser 3400 and the pump 3500 may be disposed in the line connecting the storage tank 3100 to the water supply tank 3200. The second condenser 3400 changes the carbon dioxide having the gases state into carbon dioxide having a liquid state. The pump 3500 changes the liquid carbon dioxide into gases carbon dioxide compressed over a critical pressure to supply the gases carbon dioxide into the water supply tank 3200. The water supply tank 3200 may heat the supplied carbon dioxide at a temperature over a critical temperature to produce the supercritical fluid, and then transfer the supercritical fluid into the second process chamber 2500. Here, the carbon dioxide discharged from the water supply tank 3200 may be in a state which the carbon dioxide is compressed at a pressure of about 100 bar to about 150 bar. When the liquid or gaseous carbon dioxide is required in the second process chamber 2500 according to the progression of the processes, the water supply tank 3200 may supply the liquid or gaseous carbon dioxide into the second process chamber 2500.

Figure 7:
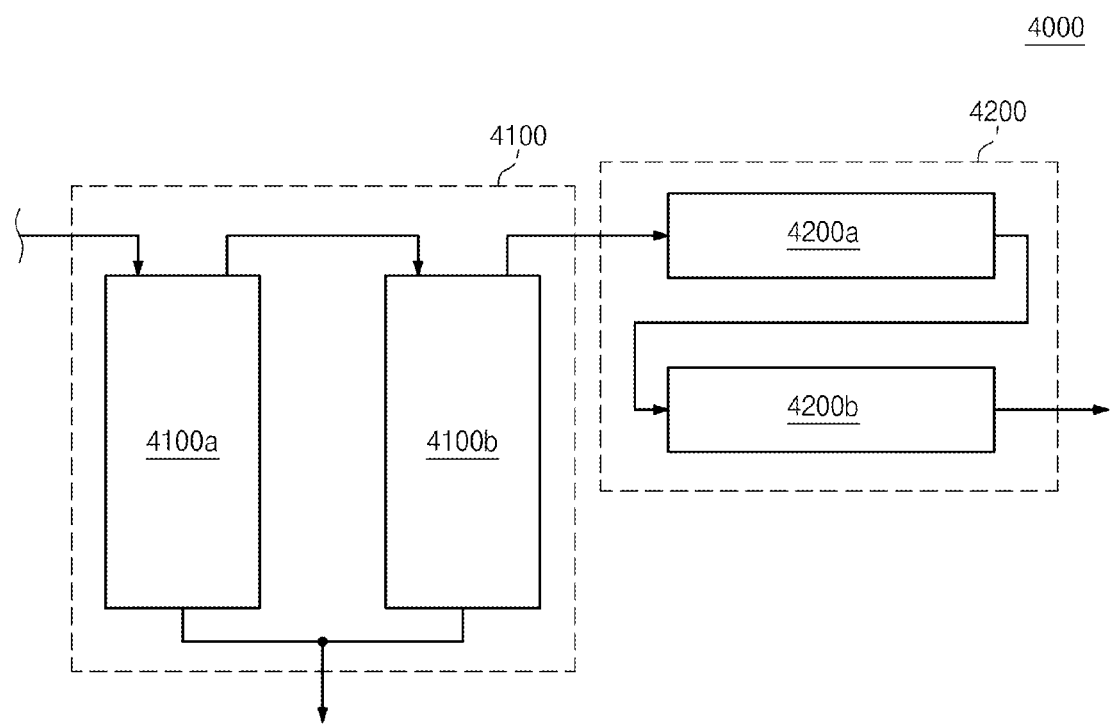
FIG. 7 is a view of a recycling unit of FIG. 6 according to an embodiment of the present invention.
Figure 8:
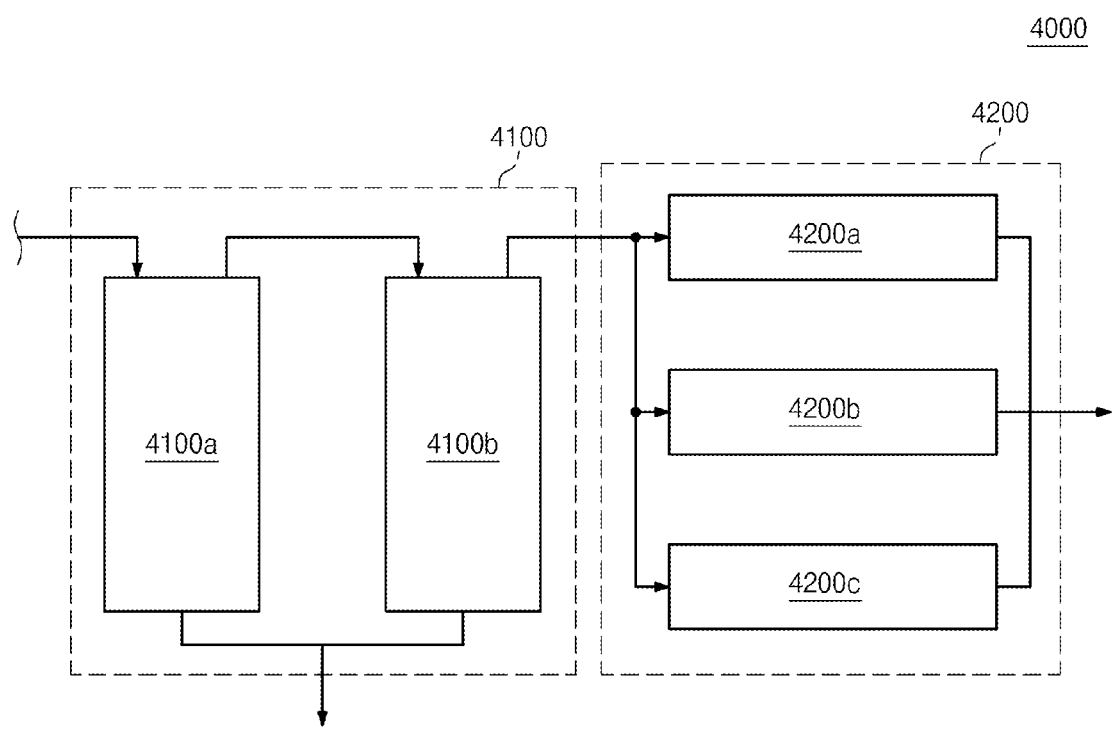
FIG. 8 is a view of a recycling unit of FIG. 6 according to another embodiment of the present invention.

FIG. 7 is a view of the recycling unit of FIG. 6 according to an embodiment of the present invention, and FIG. 8 is a view of a recycling unit 4000 of FIG. 6 according to another embodiment of the present invention.

The recycling unit 4000 recycles the supercritical fluid containing an organic solvent used for the second drying process in the second process chamber 2500 to supply the recycled supercritical fluid into the supercritical fluid supply unit 3000. The recycling unit 4000 may include at least one of a separation module 4100 and a column module 4200.

The separation module 4100 cools carbon dioxide to liquefy the organic solvent contained in the carbon dioxide, thereby separating the organic solvent from the carbon dioxide. The column module 4200 allows the carbon dioxide to pass through a space in which an absorption material A for absorbing the organic solvent is disposed to separate the organic solvent from the carbon dioxide.

A plurality of separation modules 4100 may be provided in the recycling unit 4000. Here, the separation modules 4100 may be connected to each other in series. For example, the first separation module 4100*a* is connected to the second process chamber 2500 to separate the carbon dioxide and the organic solvent from each other firstly. Then, the second separation module 4100*b* is connected to the first separation module 4100*a* to separate the carbon dioxide and the organic solvent from each other secondly. Thus, the separation of the carbon dioxide and the organic solvent by the separation module 4100 may be performed several times to obtain more pure carbon dioxide.

Also, a plurality of column modules 4200 may be provided in the recycling unit 4000. Here, the column modules 4200 may be connected to each other in series. Also, the separation of the carbon dioxide and the organic solvent by the column modules 4200 may be performed several times. For example, the first column module 4200*a* is connected to the separation module 4100 to filter the organic solvent from the carbon dioxide firstly. Then, the second column module 4200*b* is connected to the first column module 4200*a* to filter the organic solvent from the carbon dioxide secondly.

Alternatively, the column modules 4200 may be connected parallel to each other. Here, it may take a long time to separate the organic solvent using the column module 4200. Also, it may be difficult to filter a large amount of carbon dioxide using the column module 4200. However, when the plurality of column module are disposed parallel to each other, a large amount of carbon dioxide may be filtered. For example, each of the first, second, and third column modules 4200*a*, 4200*b*, and 4200*c* is connected to the separation module 4100 to filter the organic solvent from the carbon dioxide, thereby providing the carbon dioxide into the supercritical fluid supply unit 3000.

Figure 9:
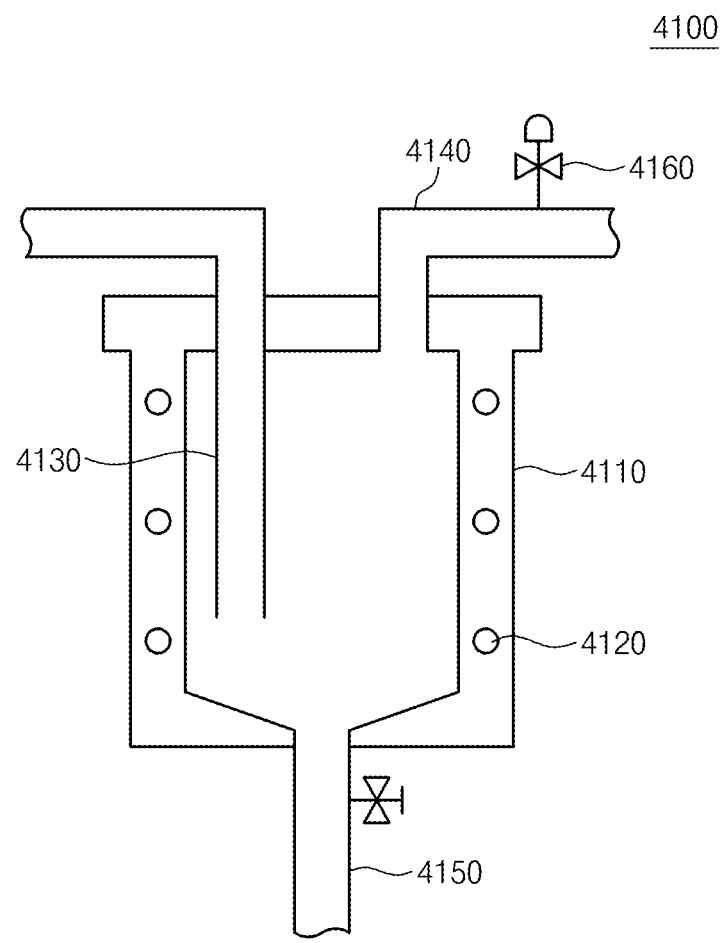
FIG. 9 is a sectional view of a separation module of FIG. 7.

FIG. 9 is a sectional view of the separation module 4100 of FIG. 8. The separation module 4100 may include a separation tank 4110, a cooling member 4120, an inflow tube 4130, an exhaust tube 4140, a drain tube 4150, and a pressure regulator 4160.

The separation tank 4110 provides a space in which the carbon dioxide and the organic solvent are separated from each other. The cooling member 4120 is disposed between an inner wall and an outer wall of the separation tank 4110 to cool the separation tank 4110. The cooling member 4120 may be realized as a pipe line through which cooling water flows.

The carbon dioxide discharged from the second process chamber 2500 is introduced into the inflow tube 4130. When the separation module 4100 is provided in plurality, the carbon dioxide discharged from the former separation module 4100 may be introduced into the inflow tube 4130. The inflow tube 4130 has one end through which the carbon dioxide is supplied into a lower portion of the separation tank 4110. The carbon dioxide supplied into the lower portion of the separation tank 4110 is cooled by the cooling member 4120. Thus, an organic solvent contained in the carbon dioxide is liquefied to separate the organic solvent from the carbon dioxide.

The separated carbon dioxide is discharged through the exhaust tube 4140 connected to an upper portion of the separation tank 4110, and the liquid organic solvent is discharged through the drain tube 4150 connected to a lower portion of the separation tank 4110. A valve V may be disposed in each of the inflow tube 4130, the exhaust tube 4140, and the drain tube 4150 to control the inflow and discharge.

The pressure regulator 4160 regulates an internal pressure of the separation tank 4110. For example, the pressure regulator 4160 may be a reverse pressure regulator disposed in the exhaust tube 4140.

Figure 10:
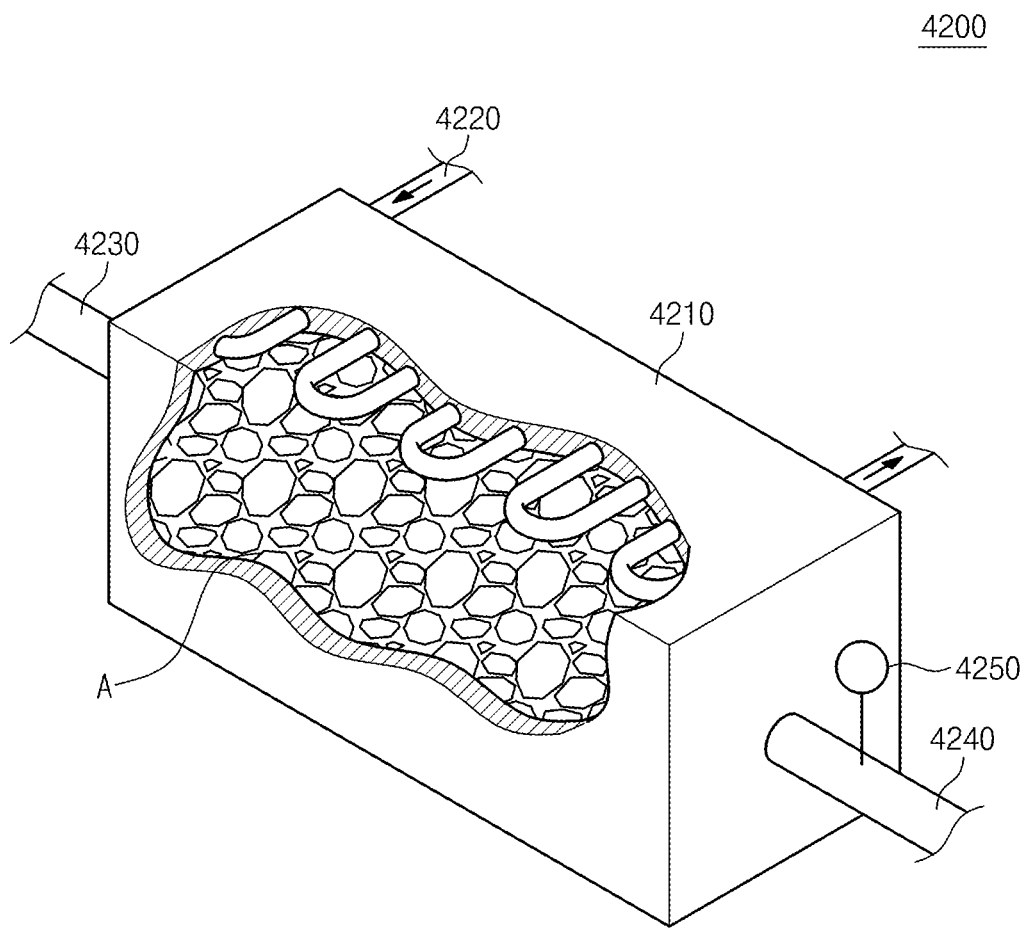
FIG. 10 is a sectional view of a column module of FIG. 6.

FIG. 10 is a view of the column module 4200 of FIG. 6. The column module 4200 may include an absorption column 4210, a temperature maintenance member 4220, an inflow tube 4230, an exhaust tube 4240, and a concentration sensor 4250.

The absorption column 4210 provides a space in which an organic solvent is separated from carbon dioxide. An absorption material A is disposed within the absorption column 4210. Here, the absorption material A may be a material for absorbing the organic solvent. For example, the absorption material A may be zeolite. The carbon dioxide is introduced into the absorption column through the inflow tube 4230. The inflow tube 4230 may be connected to the separation module 4100. When the column module 4200 is provided in plurality in series, the inflow tube 4230 may be connected to the former column module 4200. The carbon dioxide passes through the absorption column 4210 and is discharged into the exhaust tube 4240.

The absorption material A is provided to carbon dioxide while the carbon dioxide passes through the absorption column 4210 to absorb an organic solvent from the carbon dioxide. Accordingly, the organic solvent contained in the carbon dioxide is removed to recycle the carbon dioxide. When the carbon dioxide and the organic solvent are separated from each other, heat may occur. Thus, the temperature maintenance member 4220 may maintain the inside of the absorption column 4210 at a predetermined temperature so that the organic solvent is easily separated from the carbon dioxide.

The concentration sensor 4250 may detect a concentration of the organic solvent contained in the carbon dioxide discharged from the absorption column 4210. The concentration sensor 4250 is disposed in the exhaust tube 4240. When a plurality of absorption columns 4210 are provided in series, the concentration sensor 4250 may be disposed in only the last absorption column 4210. Of cause, the concentration sensor 4250 may be disposed in each of the absorption columns 4210. Since an amount of organic solvent capable of being absorbed by the absorption material A is limited, when the organic solvent contained in the carbon dioxide discharged through the concentration sensor 4250 has a concentration greater than a preset concentration, the absorption material A may be replaced. The carbon dioxide discharged from the column module 4200 is supplied into the supercritical fluid supply unit 3000.

Although the column module 4200 is connected to the separation module 4100 in the recycling unit 4000 in the current embodiment, the present invention is not limited thereto. For example, when the separation module 4100 is omitted in the recycling unit 4000, the column module 4200 may be directly connected to the second process chamber 2500.

Hereinafter, a substrate treatment method using the substrate treatment apparatus 100 according to the present invention will be described.

This is merely an example for convenience of descriptions, and thus, the substrate treatment method, the supercritical fluid recycling method, and the supercritical fluid discharge method according to the present invention may be performed using other substrate treatment apparatuses capable of performing a function equal or similar to that of the substrate treatment apparatus 100, except for the apparatus 100 for treating a substrate according to the present invention.

Figure 11:
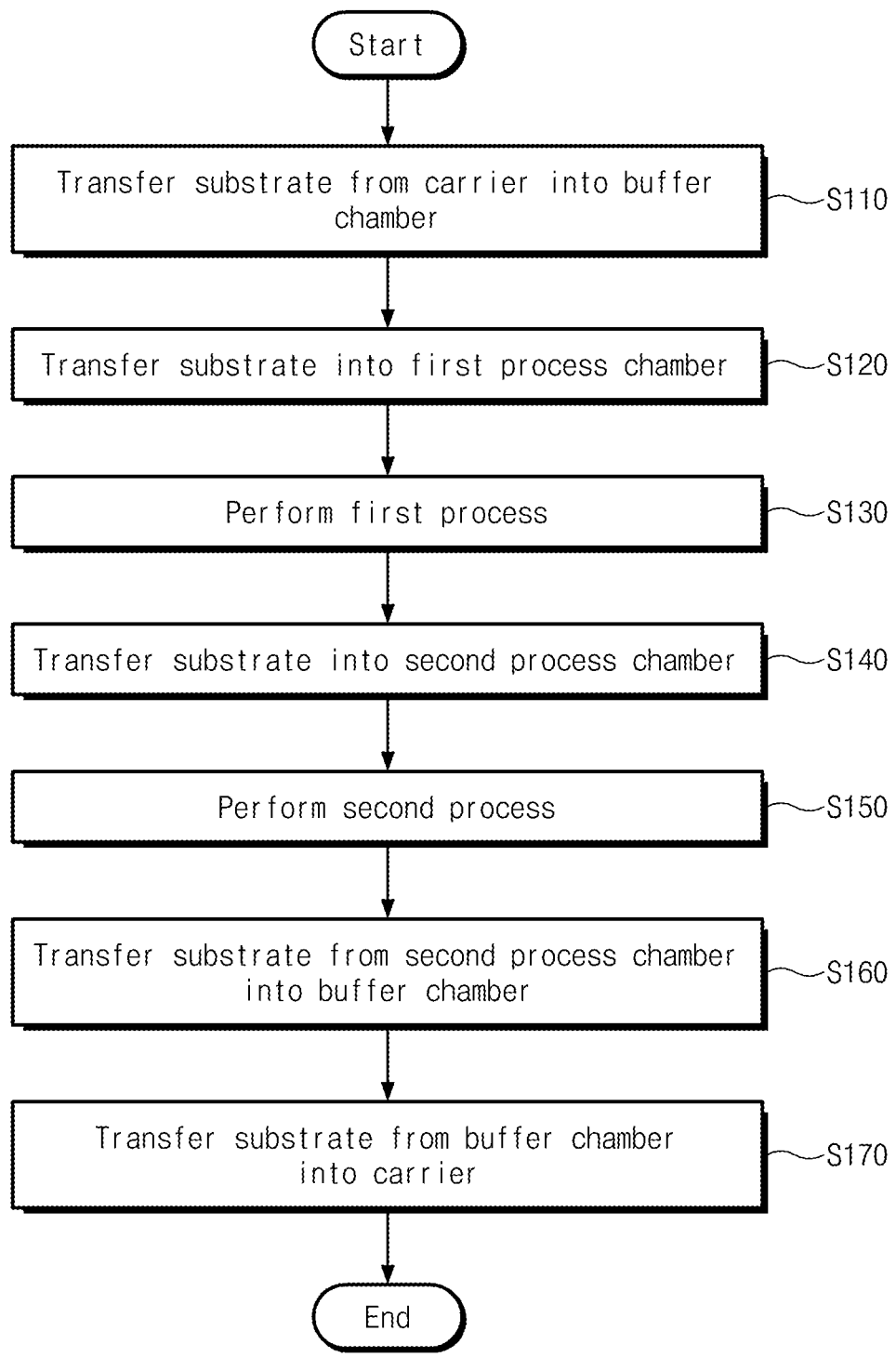
FIG. 11 is a flowchart illustrating a process for treating a substrate according to an embodiment of the present invention.

FIG. 11 is a flowchart illustrating a substrate treatment method according to an embodiment of the present invention. The substrate treatment method according to the embodiment of the present invention may be a cleaning process using a supercritical fluid.

The substrate treatment method according to the embodiment of the prevent invention includes transferring a substrate S from a carrier C seated on a load port 1100 into a buffer chamber 2100 (S110), transferring the substrate S from the buffer chamber 2100 into a first process chamber 2300 (S120), performing a first process (S130), transferring the first process chamber 2300 into a second process chamber 2500 (S140), performing a second process (S150), transferring the substrate S from the second process chamber 2500 into the buffer chamber 2100 (S160), and transferring the substrate S from the buffer chamber 2100 into the carrier C (170). Hereinafter, each of the processes will be described.

In operation S110, an index robot 1210 transfers the substrate S from the carrier C into the buffer chamber 2100.

The carrier C receiving the substrate S transferred from the outside is placed on the load port 1100. A carrier opener (not shown) or the index robot 1210 opens a door of the carrier C so that the index robot 1210 takes the substrate S out of the carrier C. Then, the index robot 1210 transfers the substrate taken out of the carrier C into the buffer chamber 2100.

In operation S120, the transfer robot 2210 transfers the substrate S from the buffer chamber 2100 into the first process chamber 2300.

When the substrate S is placed on a buffer slot of the buffer chamber 2100 by the index robot 1210, a transfer robot 2210 takes the substrate S out of the buffer slot. The transfer robot 2210 transfers the substrate S into the first process chamber 2300.

Figure 12:
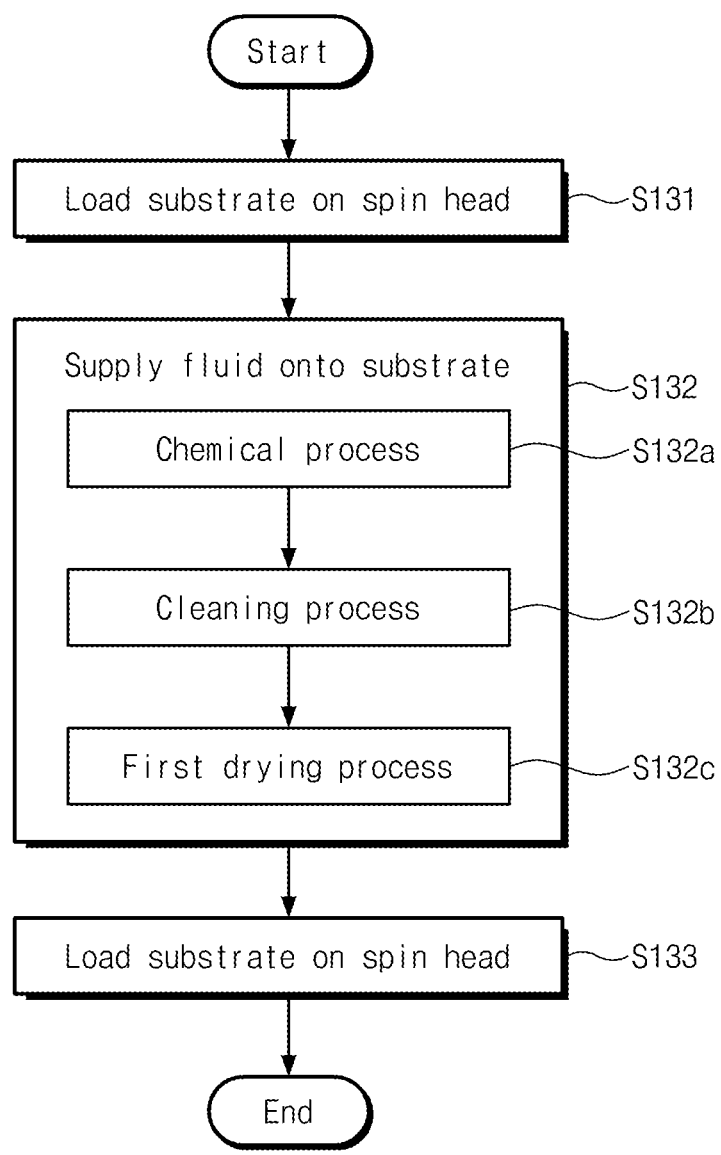
FIG. 12 is a flowchart illustrating a first process according to an embodiment of the present invention.

In operation S130, the first process chamber performs the first process. FIG. 12 is a flowchart illustrating a first process according to an embodiment of the present invention.

In operation S131, the substrate S is placed on a support pin 2412 by the transfer robot 2210 and loaded on a spin head 2410. When the substrate S is placed on the support pin 2412, a chucking pin 2413 is moved from a pick-up position to a fixing position to fix the substrate S. When the substrate S is seated, a fluid supply member 2420 supplies a fluid onto the substrate S in operation S132. Here, the spin head 2410 is rotated to rotate the substrate S while the fluid is supplied onto the substrate S. Thus, the fluid may be uniformly supplied onto an entire surface of the substrate S. Also, a recovery container 2430 may be vertically moved to recover the fluid bouncing from the substrate S by the rotation of the substrate S after the fluid is supplied onto the substrate S.

Specifically, when the substrate S is seated, a first fluid supply member 2420a is moved from a standby position to a process position to spray a first detergent onto the substrate S in operation S132a (a first chemical process). Thus, particles, organic contaminants, metal impurities, and the like remaining on the substrate S may be removed. Here, a first inflow hole 2431a of the first recovery container 2430a may be moved to the same horizontal plane as the substrate S to recover the first detergent.

Next, in operation S132b (a first cleaning process), the first fluid supply member 2420a is moved to the standby position, and a second fluid supply member 2420b is moved from the standby position to the process position to spray a rinsing agent. Thus, residues of the first detergent remaining on the substrate S may be cleaned. Here, a second inflow hole 2431b of a second recovery container 2430b may be moved to the same horizontal plane as the substrate S to recover the rinsing agent.

Next, in operation S132c (a first drying process), the second fluid supply member 2420b returns to the standby position, and a third fluid supply member 2420c is moved from the standby position to the process position to spray an organic solvent. Thus, the rinsing agent remaining on the substrate S may be substituted for the organic solvent. Here, a third inflow hole 2431c of the third recovery container 2430c may be moved to the same horizontal plane as the substrate S to recover the organic solvent. Also, the organic solvent may be supplied in a state where the organic solvent in heated at a temperature greater than room temperature or in a heated vapor state. Also, in the operation S132c, the spin head 2410 may rotate the substrate S so that the organic solvent is easily dried after the spray of the organic solvent is finished.

A process (a second chemical process) in which a fourth fluid supply member 2420d sprays a second detergent and a process (a second cleaning process) in which the second fluid supply member 2420b sprays the rinsing agent again may be additionally performed between the operation S132b and the operation S132c. Here, the first and second detergents may be provided as components different from each other to effectively remove foreign substances different from each other, respectively.

Also, the operation S132c may be omitted as necessary.

When the spray of the fluid onto the substrate S is finished, the rotation of the spin head 2410 may be finished, and the chucking pin 2413 may be moved from the fixed position to the pick-up position. In operation S133, the substrate S may be picked up by the transfer robot 2210 and unloaded from the spin head 2410.

In operation S140, the transfer robot 2210 transfers the substrate S from the first process chamber 2300 into the second process chamber 2500.

The transfer robot 2210 picks up the substrate S seated on the spin head 2140 to take the substrate out of the first process chamber 2300. The transfer robot 2210 transfers the substrate S into the second process chamber 2500. The substrate S transferred into the second process chamber 2500 is seated on the support member 2530.

Figure 13:
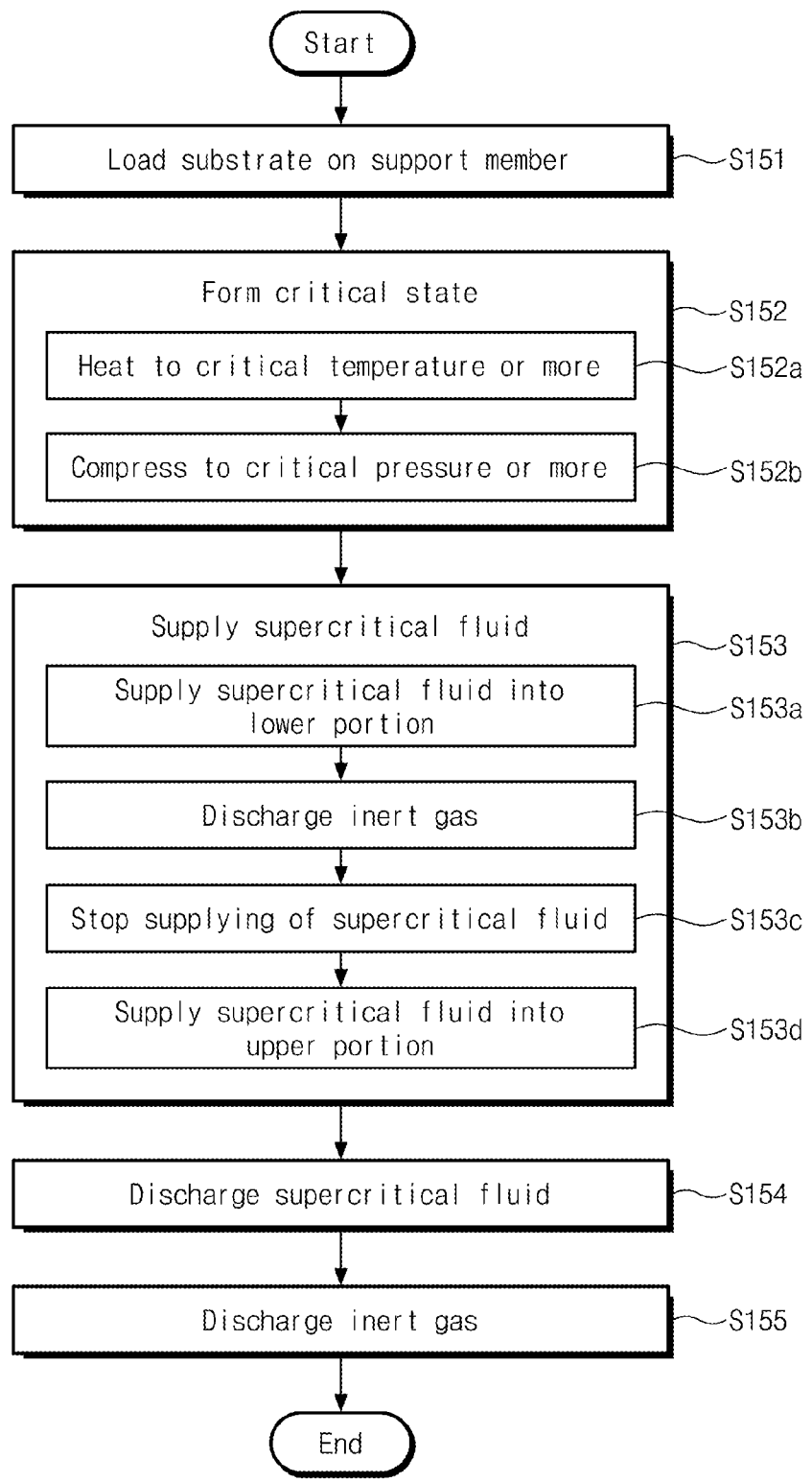
FIG. 13 is a flowchart illustrating a second process according to an embodiment of the present invention.

In operation S150, the second process chamber 2500 performs the second process. FIG. 13 is a flowchart illustrating the second process according to an embodiment of the present invention.

In operation S151, the substrate S is loaded on the support member 2530 of the second process chamber 2500. In operation S152, a critical state is formed within a housing 2510 after and before the substrate S is loaded. Here, the critical state may represent a state in which a temperature and pressure exceed a critical temperature and critical pressure, respectively.

In operation S152a, a heating member 2520 heats the inside of the housing 2510 to form the critical state. Thus, the inside of the housing 2510 may be increased to a temperature greater than the critical temperature. Next, in operation S152b, an inert gas is introduced into the housing 2510 through a gas supply tube 2560. Thus, the inside of the housing 2510 may be filled with the inert gas, and be increased to a pressure greater than the critical pressure.

When the critical state is formed, a supercritical fluid is supplied into the housing 2510 through a supercritical fluid supply tube 2540 in operation S153. For example, the operation S153 may be performed as follows.

First, in operation S153a, the supercritical fluid may be supplied from a lower portion of the housing 2510 through a lower supply tube 2540b. Here, in operation S153b, the inert gas may be discharged to the outside through a discharge tube 2550.

Since the supercritical fluid is continuously supplied and the inert gas is charged, the inside of the housing 2510 may be filled with only the supercritical fluid to form a supercritical fluid phenomenon.

When the supercritical phenomenon is formed, the supply of the supercritical fluid through the lower supply tube 2540b is stopped in operation S153c to supply the supercritical fluid through an upper supply tube 2540a in operation S153d. Thus, the drying of the substrate S using the supercritical fluid may be quickly performed. In this process, since the inside of the housing 2510 is in the critical state, the substrate S may be less damaged or not be damaged even though the supercritical fluid is directly sprayed at a high speed onto the substrate S.

When the substrate S is dried, the supercritical fluid is discharged in operation S154. Here, the inert gas may be supplied into the housing 2510 to discharge the supercritical fluid.

Figure 14:
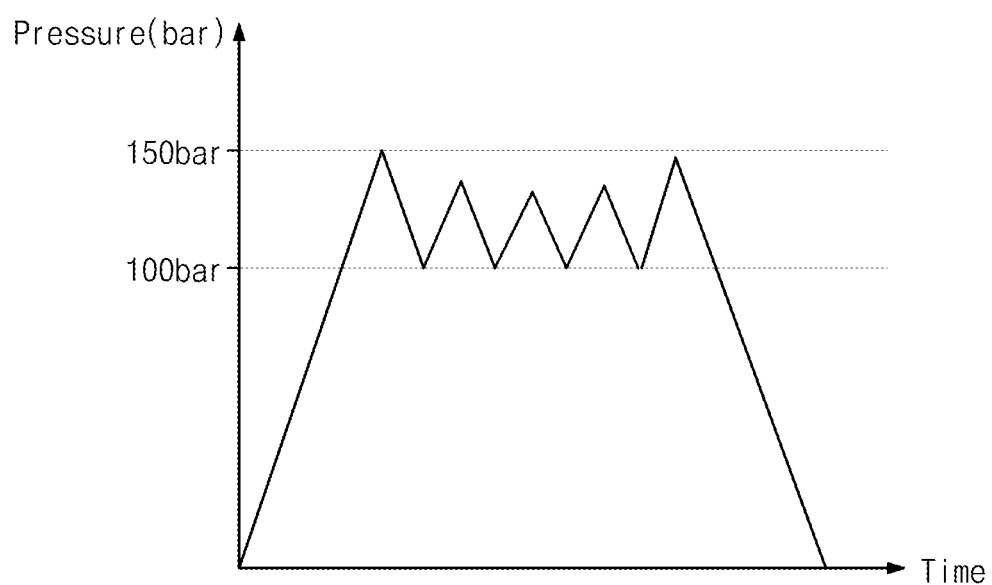
FIG. 14 is a view illustrating supplying and discharging of the supercritical fluid.

On some occasion, since the substrate S is not sufficiently dried in the operation S153, the operation S153 and the S154 may be repeatedly performed as necessary. FIG. 14 is a view illustrating supplying and discharging of the supercritical fluid. For example, the supercritical fluid may be supplied in the operation S153 until the inside of the housing 2510 has a pressure of about 150 bar, and then the supercritical fluid may be discharged until the inside of the housing 2510 has a pressure of about 100 bar.

Also, according to experiments, since it is observed that a removal rate of isopropyl alcohol remaining on circuit patterns of the substrate S is significantly increased in a case where the substrate S is repeatedly dried under the supercritical atmosphere and the inert atmosphere when compared that the substrate S is dried for a long time under the supercritical atmosphere, the two operations S153 and 154 may be repeatedly performed to increase the drying efficiency. Alternatively, the operation S153 may be performed for a long time to dry the substrate S.

When the discharging of the supercritical fluid is finished, the inert gas is discharged to decrease an internal pressure of the housing 2510 in operation S155.

Although the second drying process is performed using the inert gas in the current embodiment, the present invention is not limited thereto. For example, the second drying process may be performed using only the supercritical fluid without the inert gas. Particularly, liquid carbon dioxide may be supplied first, and then, the liquid carbon dioxide may be continuously heated to change the liquid carbon dioxide into gaseous carbon dioxide. Then, the gaseous carbon dioxide may be compressed to form the supercritical atmosphere.

When the substrate S is dried using the supercritical fluid, generation of particles, static electricity, and the pattern collapse which occur in the first drying process using the isopropyl alcohol or in the spin drying process in which the substrate S is rotated may be prevented, and also, generation of water marks on a surface of the substrate S may be prevented to improve performance and yield of the semiconductor device.

In operation S160, the transfer robot 2210 transfers the substrate S from the second process chamber 2500 into the buffer chamber 2100. When the second process is finished, the transfer robot 2210 unloads the substrate S from the support member 2530 to take the substrate S out of the second process chamber 2500, thereby mounting the substrate S on the buffer slot of the buffer chamber 2100.

In the operations S120, S140, and S160, a portion of the substrates or the whole substrates may be transferred by arms 2213 of transfer robots 2210 different from each other. For example, in each of the operations S120, S140, and S160, the substrate S may be transferred by arms 2213 of the transfer robots 2210 different from each other. Alternatively, the substrate S may be transferred by the same arm 2213 in the operations S120 and 140, and the substrate S may be transferred by a different arm 2213 in the operation S160. This is done for preventing that a hand of the arm 2213 is contaminated because the substrate S has different states in the operations S120, S140, and S160 to secondarily contaminate the substrate S transferred into the next operation by the contaminated arm 2213. Particularly, in the operation S120, the transferred substrate S may be a substrate S before the cleaning process is performed. Also, in operation S140, the substrate S may be a substrate which is not dried. That is, the foreign substances, the detergent, the rinsing agent, or the organic solvent may remain on the substrate S, and thus, the hand of the arm 2213 may be contaminated by the above-described materials. Thus, when the substrate S is picked up by the arm 2213 stained with the above-described materials in the second process, the substrate S may be contaminated again.

In operation S170, the index robot 1210 transfers the substrate C from the buffer chamber 2100 into the carrier C. The index robot 1210 holds the substrate S mounted on the buffer slot to mount the substrate on a slot of the carrier C. Here, the operation S190 may be performed using an arm 1213 different from the arm 1213 used in the operation S110. Thus, as described above, it may prevent the substrate S from being contaminated. When all substrates S are completely received, the carrier C may be transferred to the outside by an overhead hoist transfer (OHT).

Figure 15:
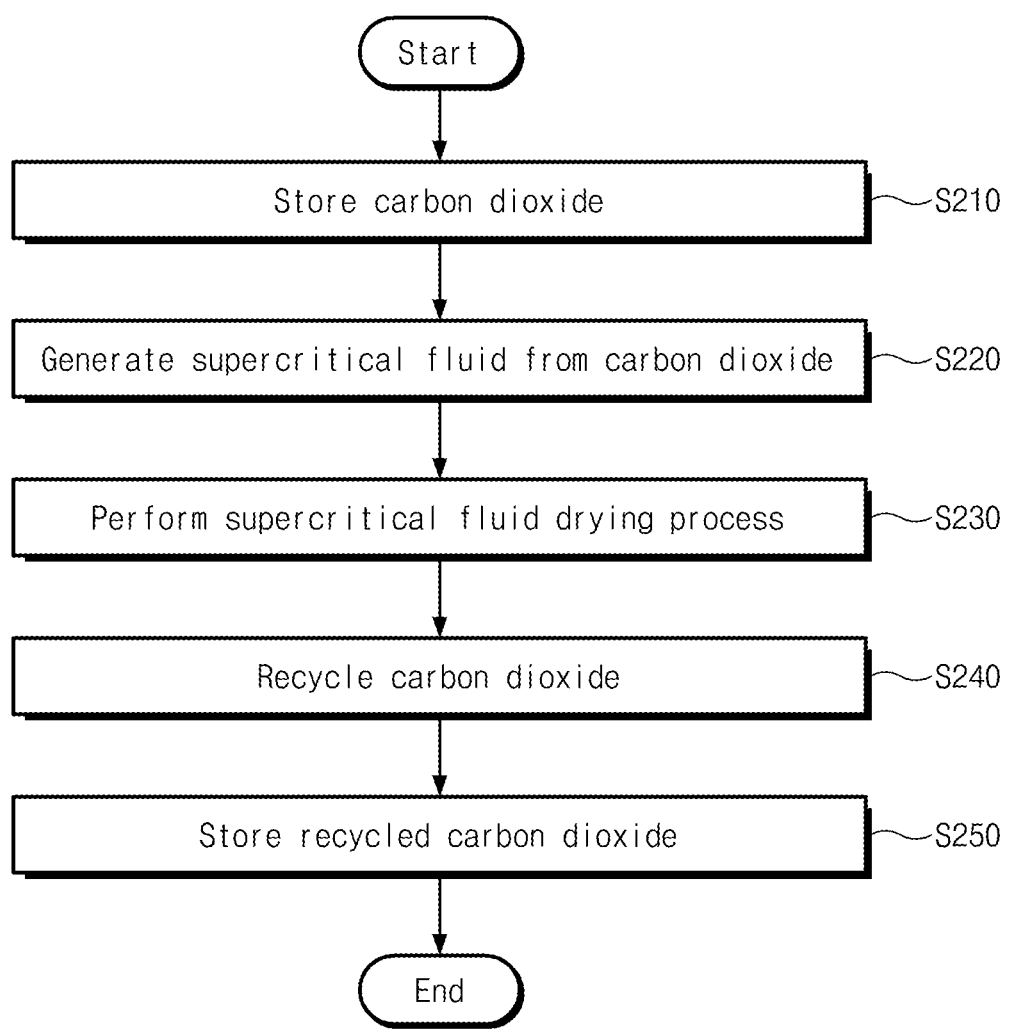
FIG. 15 is a flowchart illustrating a process for treating a substrate according to another embodiment of the present invention.

FIG. 15 is a flowchart illustrating a process for treating a substrate according to another embodiment of the present invention. The substrate treatment method according to another embodiment of the present invention may be a cleaning process using a supercritical fluid.

The supercritical fluid recycling method according to another embodiment includes storing carbon dioxide (S210), changing the carbon dioxide into a supercritical fluid (S220), performing a drying process using the supercritical fluid (S230), recycling the carbon dioxide (S240), and storing the recycled carbon dioxide (S250). Hereinafter, each of the processes will be described.

In operation S210, carbon dioxide is stored in a storage tank 3100. The carbon dioxide is received from an external carbon dioxide supply source F or a recycling unit 4000 and stored in a liquid state. Here, the carbon dioxide may be received in a gaseous state. Thus, a first condenser 3300 may change the gaseous carbon dioxide into the liquid carbon dioxide to supply the liquid carbon dioxide into the storage tank 3100.

In operation S220, a water supply tank 3200 changes the carbon dioxide into a supercritical fluid. The water supply tank 3200 may receive the carbon dioxide from the storage tank 3100 to change the carbon dioxide into the supercritical fluid. Particularly, the carbon dioxide is discharged from the storage tank 3100 and moved into the water supply tank 3200. Here, the carbon dioxide may be changed into the gaseous carbon dioxide by a change of a pressure. A second condenser 3400 and a pump 3500 are disposed in a line connecting the storage tank 3100 and the water supply tank 3200. The second condenser 3400 changes the gaseous carbon dioxide into the liquid carbon dioxide, and the pump 3500 changes the liquid carbon dioxide into high-pressure gaseous carbon dioxide to supply the high-pressure gaseous carbon dioxide into the water supply tank 3200. The water supply tank 3200 heats the high-pressure gaseous carbon dioxide to produce a supercritical fluid. The water supply tank 3200 provides the supercritical fluid into the second process chamber 2500.

In operation S230, the second process chamber 2500 performs a drying process using the supercritical fluid. The second process chamber 2500 receives the supercritical fluid from the water supply tank 3200 to dry the substrate S using the supercritical fluid. Here, the drying process may be the above-described second drying process. The second process chamber 2500 discharges the supercritical fluid during or after the drying process.

In operation S240, the recycling unit 4000 recycles the carbon dioxide.

In operation S241, a separation module 4100 cools the discharged supercritical fluid to separate an organic solvent from the supercritical fluid. When the supercritical fluid is introduced into the separation tank 4110, a cooling member 4120 cools the supercritical fluid to liquefy the organic solvent dissolved in the supercritical fluid, thereby separating the organic solvent. The organic solvent is discharged through a drain tube 4150 disposed at a lower portion of the separation tank 4110, and the carbon dioxide separated from the organic solvent is separated through an upper exhaust tube 4140 disposed at an upper portion of the separation tank 4110. In the separation through the cooling of the supercritical fluid, an internal temperature of the separation tank 4110 is important.

Figures 16, 17:
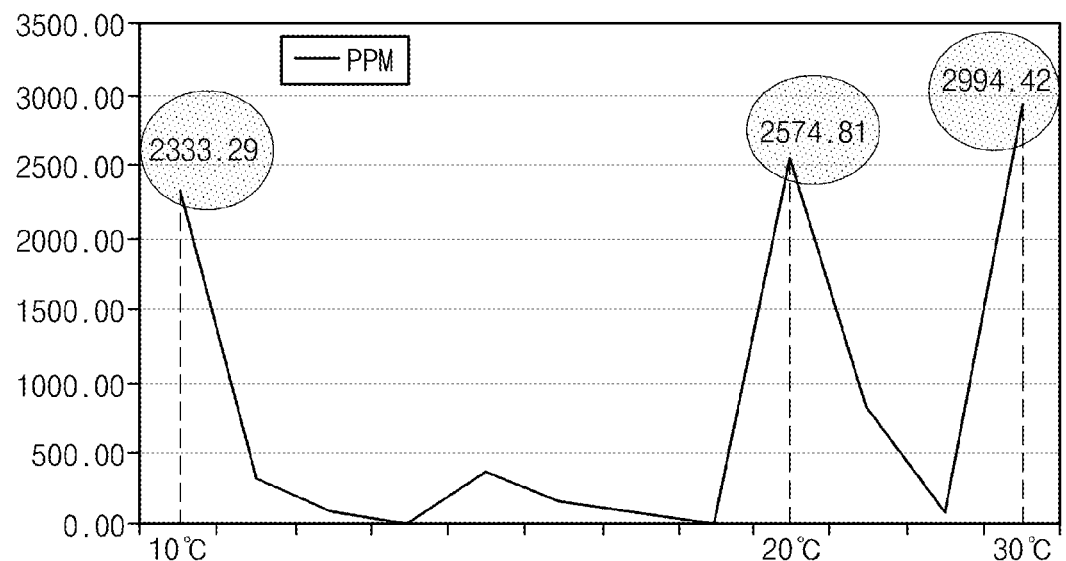
FIG. 16 is a graph illustrating efficiency of a separation unit.
FIG. 17 is a table illustrating the efficiency of the separation unit.

FIG. 16 is a graph illustrating efficiency of the separation unit 4100, and FIG. 17 is a table illustrating the efficiency of the separation unit 4100. FIGS. 16 and 17 illustrate an amount and efficiency of an organic solvent drained when the separation tank 4110 has internal temperatures of about 10° C., about 20° C., and about 30° C. As described above, when the operation S241 is performed at a temperature of about 10° C., it is seen that separation efficiency is improved by about 10% when compared that the operation S241 is performed at a temperature of about 30° C.

In operation S242, a column module 4200 separates the organic solvent again from the carbon dioxide in which the organic solvent is separated primarily by the separation module 4100. The supercritical fluid or the gaseous carbon dioxide is introduced through the inflow tube 4230 to pass through an absorption column 4210, and then is discharged into an exhaust tube 4240. Here, the carbon dioxide passes through an absorption material A. In this process, the organic solvent dissolved in the carbon dioxide is absorbed into the absorption material A. Thus, the organic solvent is separated, and pure carbon dioxide is discharged through the exhaust tube 4240. Therefore, the carbon dioxide may be recycled through the above-described processes.

In operation S250, the recycling unit 4000 provides the recycled carbon dioxide into the storage tank 3100. When the recycling process is finished, the carbon dioxide is moved and stored into the storage tank 3100. Here, the carbon dioxide discharged from the recycling unit 4000 is in gaseous state. Thus, the gaseous carbon dioxide is changed into liquid carbon dioxide by the first condenser 3300 and stored in the storage tank 3100.

In the above-described substrate treatment method according to the present invention, the processes performed in each embodiment are not necessary. Thus, each embodiment may selectively include the above-described processes. Furthermore, the embodiments may be realized by being separated from or combined with each other. Also, the processes performed in each embodiment may be realized by separating or combining the processes performed in the other embodiment from or with each other.

Also, it is not necessary to successively perform the processes performed in each embodiment according the described order. For example, a process described later may be performed first than a process described previously.

Also, the substrate treatment method according to the present invention may be stored in a computer readable recording medium with a code or program for executing the substrate treatment method.

According to the present invention, the substrate may be dried using the supercritical fluid.

According to the present invention, the substrate may be dried using the supercritical fluid to efficiently perform the drying process and prevent the substrate from being damaged.

According to the present invention, the supercritical fluid used in the drying process may be recycled.

According to the present invention, the supercritical fluid is cooled to separate the organic solvent.

According to the present invention, the absorption material for absorbing the organic solvent may be used to separate the organic solvent form the fluid which is provided as the supercritical fluid.

According to the present invention, the supercritical fluid may be reused again in the drying process to reduce manufacturing costs and prevent the environmental pollution from occurring.

The feature of the present invention is not limited to the aforesaid, but other features not described herein will be clearly understood by those skilled in the art from this specification and the accompanying drawings.

While specific embodiments of the present invention have been shown and described, it should be understood that other modifications, substitutions and alternatives are apparent to the ordinary skill in the art. Such modifications, substitutions and alternatives can be made without departing from the spirit and scope of the invention and are not limited by the foregoing embodiments and the attached drawings. Also, part or all of the above-described embodiments can be selectively combined and constructed so that various modifications are possible, without the construction and scheme of the above-described embodiments being limitedly applied.

What is claimed is:

1. An apparatus configured to treat a substrate, the apparatus comprising:
    a process chamber configured to
        direct a supercritical fluid to the substrate to dry the substrate, based on dissolving an organic solvent on the substrate within the fluid to generate a fluid that includes the organic solvent dissolved therein, and
        discharge the fluid from the process chamber; and
    a recycler configured to
        receive the fluid discharged from the process chamber, and
        separate the organic solvent from the fluid, such that the fluid is recycled as the supercritical fluid;
    the recycler including a separator configured to remove heat from the recycler, in an absence of a heat input that is independent of the fluid to the recycler, to liquefy the organic solvent and separate the organic solvent from the fluid based on cooling the fluid.

2. The apparatus of claim 1, wherein the recycler includes a plurality of separators that are connected to each other in series.

3. The apparatus of claim 1, wherein the separator includes,
    a separation tank configured to receive the fluid discharged from the process chamber;
    a cooling member configured to remove heat from the separation tank, such that the organic solvent dissolved in the fluid is liquefied and separated from the fluid based on cooling of the fluid;
    a drain tube in a lower portion of the separation tank, the drain tube configured discharge the organic solvent liquefied and separated from the fluid; and
    a first exhaust tube in an upper portion of the separation tank, the first exhaust tube configured to discharge the recycled supercritical fluid.

4. The apparatus of claim 3, wherein the cooling member is between an inner wall of the separation tank and an outer wall of the separation tank.

5. The apparatus of claim 3, wherein the cooling member includes a pipe line configured to circulate cooling water to remove heat from the separator.

6. The apparatus of claim 3, wherein the separator further includes an inflow tube configured to direct the received fluid into the lower portion of the separation tank.

7. The apparatus of claim 3, wherein the separator further includes a reverse pressure regulator in the first exhaust tube, the reverse pressure regulator configured to constantly maintain an internal pressure of the separation tank.

8. The apparatus of claim 1, wherein the recycler further includes a column module including an absorption material, the absorption material configured to absorb organic solvent from fluid discharged from the separator to separate the organic solvent from the fluid.

9. The apparatus of claim 8, wherein the recycler further includes a plurality of column modules that are connected to each other in series.

10. The apparatus of claim 8, wherein the recycler further includes a plurality of column modules that are connected to each other in parallel.

11. The apparatus of claim 8, wherein the column module includes,
    an absorption column configured to provide the absorption material in fluid communication with the fluid discharged from the separator;

a temperature maintenance member configured to constantly maintain an internal temperature of the absorption column; and a second exhaust tube configured to discharge the fluid from which the organic solvent is separated by the absorption material.

12. The apparatus of claim 11, wherein the column module further includes a concentration sensor in the second exhaust tube, the concentration sensor configured to detect a concentration of the organic solvent included in the fluid discharged from the second exhaust tube.

13. The apparatus of claim 8, wherein the absorption material includes zeolite.

14. The apparatus of claim 1, wherein the recycler includes a column module configured to provide an absorption material configured to absorb the organic solvent into the fluid discharged from the process chamber to separate the organic solvent from the fluid.

15. A method for treating a substrate, the method comprising:

directing a supercritical fluid to the substrate to dry the substrate, based on dissolving an organic solvent on the substrate within the fluid to generate a fluid that includes the organic solvent dissolved therein;

separating the organic solvent from the fluid, such that the fluid is recycled as the supercritical fluid, the separating including removing heat from a recycler in which the fluid is located, in an absence of a heat input that is independent of the fluid to the recycler, such that the fluid in which the organic solvent is dissolved is cooled to liquefy the organic solvent and separate the organic solvent from the fluid.

16. The method of claim 15, wherein the recycling further includes providing an absorption material configured to absorb the organic solvent into fluid communication with the fluid to separate the organic solvent from the fluid.

17. An apparatus configured to treat a substrate, the apparatus comprising:

a process chamber configured to
direct a supercritical fluid to the substrate to dry the substrate, based on dissolving an organic solvent on the substrate within the fluid to generate a fluid that includes the organic solvent dissolved therein;

a storage tank configured to store the supercritical fluid as a liquid state fluid;

a water supply tank configured to receive the liquid state fluid from the storage tank to produce the supercritical fluid and direct the supercritical fluid into the process chamber; and a recycler configured to separate the dissolved organic solvent from the fluid discharged from the process chamber to recycle the fluid and supply the recycled fluid into the storage tank, the recycler including a separator configured to remove heat from the recycler, in an absence of a heat input that is independent of the fluid to the recycler, to liquefy the organic solvent and separate the organic solvent from the fluid based on cooling the fluid.

18. The apparatus of claim 17, wherein the recycler further includes a column module that includes an absorption material configured to absorb organic solvent from the fluid discharged from the separator to separate the organic solvent from the fluid.

19. The apparatus of claim 18, further comprising:

a first condenser configured to change a gaseous fluid discharged from the recycler into a liquid fluid to supply the liquid fluid into the storage tank.

20. The apparatus of claim 19, further comprising:

a second condenser configured to change a gaseous fluid discharged from the storage tank into the liquid fluid; and a pump configured to receive the liquid fluid from the second condenser and to supply the liquid fluid into the water supply tank, based on compressing the liquid fluid to a pressure that is greater than a critical pressure, wherein, in the water supply tank, the fluid compressed at the pressure greater than the critical pressure is heated at a temperature greater than a critical temperature to produce the supercritical fluid.

21. A method for treating a substrate, the method comprising:

storing a liquid fluid into a storage tank;

changing the stored liquid fluid into a supercritical fluid;

dissolving an organic solvent remaining on the substrate using the supercritical fluid to dry the substrate and to generate a fluid that includes the organic solvent dissolved therein;

separating the organic solvent from the fluid in which the organic solvent is dissolved to recycle the fluid, the separating including removing heat from a recycler in which the fluid is located, in an absence of a heat input that is independent of the fluid to the recycler, such that the fluid in which the organic solvent is dissolved is cooled to liquefy the organic solvent and separate the organic solvent from the fluid; and changing the recycled fluid into the liquid fluid.

22. The method of claim 21, wherein the recycling includes providing an absorption material configured to absorb the organic solvent into fluid communication with the fluid to separate the organic solvent from the fluid.

* * * * *